(12) United States Patent
Park et al.

(10) Patent No.: US 9,859,297 B2
(45) Date of Patent: Jan. 2, 2018

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Jong-Hyun Park, Seoul (KR); Jee-Yong Kim, Hwaseong-si (KR); Dae-Seok Byeon, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/047,882

(22) Filed: Feb. 19, 2016

(65) Prior Publication Data
US 2016/0268287 A1  Sep. 15, 2016

Related U.S. Application Data

(60) Provisional application No. 62/130,868, filed on Mar. 10, 2015.

(30) Foreign Application Priority Data

Mar. 10, 2015 (KR) .......................... 10-2015-0033128
May 18, 2015 (KR) .......................... 10-2015-0068931

(51) Int. Cl.
*H01L 29/792* (2006.01)
*H01L 27/11575* (2017.01)
(Continued)

(52) U.S. Cl.
CPC .... *H01L 27/11575* (2013.01); *H01L 27/1157* (2013.01); *H01L 27/11565* (2013.01); *H01L 27/11582* (2013.01)

(58) Field of Classification Search
CPC ......... H01L 27/11575; H01L 27/11565; H01L 27/11568; H01L 27/11582; H01L 29/7926
See application file for complete search history.

(56) References Cited

U.S. PATENT DOCUMENTS 7,211,897 B2  5/2007 Yamanoue et al.
7,679,133 B2  3/2010 Son et al.
(Continued)

FOREIGN PATENT DOCUMENTS

JP  2005-150389 A  6/2005
JP  2005-183779 A  7/2005
(Continued)

*Primary Examiner* — Fernando L Toledo
*Assistant Examiner* — Neil Prasad
(74) *Attorney, Agent, or Firm* — Lee & Morse, P.C.

(57) ABSTRACT

A semiconductor device includes a substrate including cell and dummy regions, first channel structures on the cell region and extending in a first direction vertical with respect to the substrate, gate lines surrounding outer sidewalls of the first channel structures and extending in a second direction parallel to the substrate, the gate lines being spaced apart from each other along the first direction, cutting lines between the gate lines on the cell region and extending in the second direction, dummy patterns spaced apart from each other along the first direction on the dummy region, the dummy patterns having a stepped shape along a third direction parallel to the top surface of the substrate and perpendicular to the second direction, at least a portion of the dummy patterns including a same conductive material as that in the gate lines, and dummy lines through the dummy patterns.

20 Claims, 31 Drawing Sheets

(51) Int. Cl.
*H01L 27/11565* (2017.01)
*H01L 27/11582* (2017.01)
*H01L 27/1157* (2017.01)

(56) References Cited

U.S. PATENT DOCUMENTS

| | | |
|---|---|---|
| 8,242,583 B2 | 8/2012 | Yune et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,865,583 B2 | 10/2014 | Yanagidaira et al. |
| 8,921,918 B2 | 12/2014 | Shim et al. |
| 2009/0267135 A1* | 10/2009 | Tanaka .................. H01L 27/115 257/324 |
| 2009/0315187 A1* | 12/2009 | Cho ....................... H01L 23/481 257/773 |
| 2010/0012997 A1* | 1/2010 | Jang .................. H01L 27/11524 257/315 |
| 2011/0233648 A1 | 9/2011 | Seol et al. |
| 2013/0100722 A1 | 4/2013 | Shin |
| 2014/0183749 A1 | 7/2014 | Lee et al. |
| 2014/0239375 A1 | 8/2014 | Kim et al. |

FOREIGN PATENT DOCUMENTS

| | | |
|---|---|---|
| JP | 2012-212697 A | 11/2012 |
| KR | 10-2008-0061991 A | 7/2008 |
| KR | 10-2010-0102421 A | 9/2010 |
| KR | 10-2010-0127678 A | 12/2010 |

\* cited by examiner

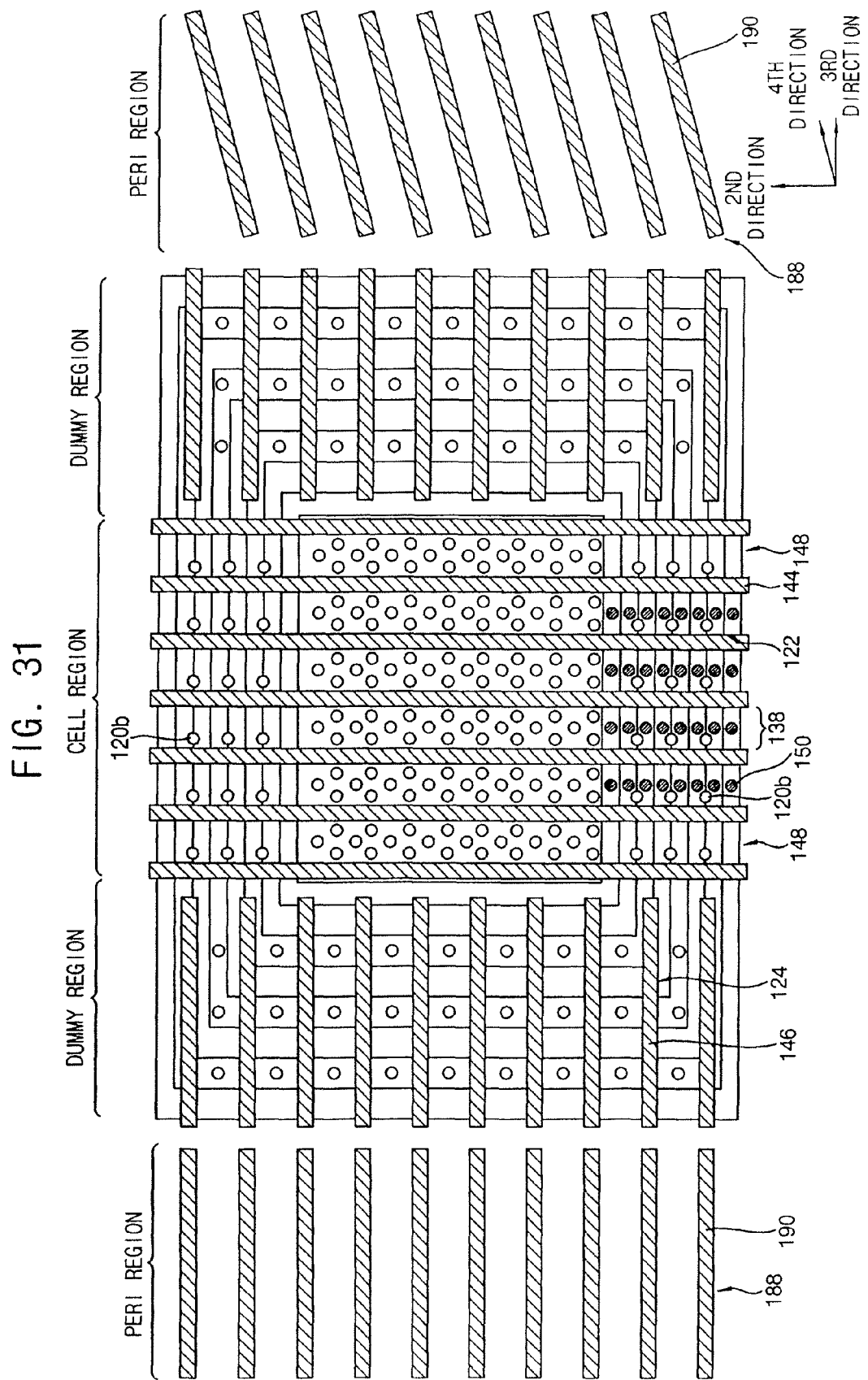

SEMICONDUCTOR DEVICES AND METHODS OF MANUFACTURING THE SAME

CROSS-REFERENCE TO RELATED APPLICATION

This U.S. Non-Provisional application claims priority under 35 USC §119 to U.S. Provisional Application No. 62/130,868, filed on Mar. 10, 2015 in the USPTO.

Korean Patent Application Nos. 10-2015-0033128, filed on Mar. 10, 2015, and 10-2015-0068931, filed on May 18, 2015, in the Korean Intellectual Property Office, and entitled: "Semiconductor Devices and Methods of Manufacturing the Same," are incorporated by reference herein in its entirety.

BACKGROUND

1. Field

Example embodiments relate to semiconductor devices and methods of manufacturing the same. More particularly, example embodiments relate to semiconductor devices including vertical channels and methods of manufacturing the same.

2. Description of the Related Art

Recently, a vertical memory device including a plurality of memory cells stacked vertically from a surface of a substrate has been developed. In the vertical memory device, a high stress may be imposed on vertically stacked layers because the memory cells may be repeatedly stacked vertically. Thus, structural and/or electrical defects may be caused in the vertical memory device.

SUMMARY

Example embodiments provide a semiconductor device having improved structural and electrical reliability.

According to example embodiments, a semiconductor device includes a substrate, first channel structures, gate lines, cutting lines, dummy patterns and dummy lines. The substrate may include a cell region and a dummy region. The first channel structures may be disposed on the cell region of the substrate. The first channel structures may extend in a first direction vertical to a top surface of the substrate. The gate lines may surround outer sidewalls of the first channel structures and extend in a second direction parallel to the top surface of the substrate. The gate lines may be spaced apart from each other along the first direction. The cutting lines may be interposed between the gate lines on the cell region. The cutting lines may extend in the second direction. The dummy patterns may be spaced apart from each other along the first direction on the dummy region. The dummy patterns may have a stepped shape along a third direction parallel to the top surface of the substrate and perpendicular to the second direction. At least a portion of the dummy patterns may include a conductive material the same as that included in the gate lines. The dummy lines may extend through the dummy patterns.

In example embodiments, the dummy region may be adjacent to an end portion of the cell region in the third direction.

In example embodiments, the dummy lines may include a conductive material the same as that included in the cutting lines.

In example embodiments, the dummy lines may extend in the third direction.

In example embodiments, a distance between the dummy lines may be equal to or greater than a distance between the cutting lines.

In example embodiments, at least one of the dummy patterns may include conductive patterns spaced apart in the second direction, and a sacrificial pattern interposed between the conductive patterns. The conductive patterns may include the conductive material the same as that of the gate lines, and the sacrificial pattern may include a nitride.

In example embodiments, the dummy lines may extend in a fourth direction diagonal to the second direction.

In example embodiments, the dummy lines may extend in the second direction.

In example embodiments, at least a portion of the dummy patterns may include the conductive material the same as that of the gate lines, and a remaining portion of the dummy patterns may include a conductive pattern and a sacrificial pattern. The conductive pattern may include the conductive material and the sacrificial pattern may include a nitride.

In example embodiments, the dummy patterns may be positioned at corresponding levels of the gate lines.

In example embodiments, the semiconductor device may further include insulating interlayer patterns between the dummy patterns neighboring in the first direction and between the gate lines neighboring in the first direction.

In example embodiments, the cutting lines may serve as common source lines, and the dummy lines may serve as dummy source lines.

In example embodiments, each of the dummy lines may have a uniform width or include different widths.

In example embodiments, the semiconductor device may further include a third channel structure extending through the dummy patterns on the dummy region of the substrate.

In example embodiments, the semiconductor device may further include a dummy cell on a portion of the cell region adjacent to the dummy region.

According to other example embodiments, a semiconductor device includes a substrate, first channel structures, gate lines, first insulating interlayer patterns, cutting lines, dummy patterns, second insulating interlayer patterns, dummy lines. The substrate may include a cell region and a dummy region. The first channel structures may be disposed on the cell region of the substrate. The first channel structures may extend in a first direction vertical to a top surface of the substrate. The gate lines may surround outer sidewalls of the first channel structures and extend in a second direction parallel to the top surface of the substrate. The gate lines may be spaced apart from each other along the first direction. The first insulating interlayer patterns may be interposed between the gate lines neighboring in the first direction. The cutting lines may be interposed between the gate lines on the cell region. The cutting lines may extend in the second direction. The dummy patterns may be spaced apart from each other along the first direction on the dummy region. The dummy patterns may have a stepped shape along a third direction parallel to the top surface of the substrate and perpendicular to the second direction. At least a portion of the dummy patterns may include a conductive material the same as that included in the gate lines. The second insulating interlayer patterns may be interposed between the dummy patterns neighboring in the first direction. The dummy lines may extend through the dummy patterns and the second insulating interlayer patterns.

According to yet other example embodiments, a semiconductor device includes a substrate including a cell region and a dummy region, first channel structures on the cell region of the substrate, the first channel structures extending in a first direction vertical with respect to a top surface of the substrate, gate lines surrounding outer sidewalls of the first channel structures and extending in a second direction parallel to the top surface of the substrate, the gate lines being spaced apart from each other along the first direction, common source lines between the gate lines on the cell region, the common source lines extending in the second direction, dummy patterns spaced apart from each other along the first direction on the dummy region, the dummy patterns having a stepped shape along a third direction parallel to the top surface of the substrate and perpendicular to the second direction, at least a portion of the dummy patterns including a same conductive material as that included in the gate lines, and dummy source lines extending through the dummy patterns and having a different configuration than the common source lines in top view.

The dummy source lines may extend in a different direction than the common source lines, as viewed in top view.

A distance between neighboring dummy source lines may be greater than a distance between neighboring common source lines.

The dummy source lines and the common source lines may include a same conductive material.

The dummy source lines may include a plurality of dummy source line segments spaced apart from each other in the second and third directions.

BRIEF DESCRIPTION OF THE DRAWINGS

Features will become apparent to those of ordinary skill in the art by describing in detail exemplary embodiments with reference to the attached drawings, in which:

FIG. 31 illustrates a top plan view of a semiconductor device in accordance with example embodiments.

DETAILED DESCRIPTION

Figure 1:
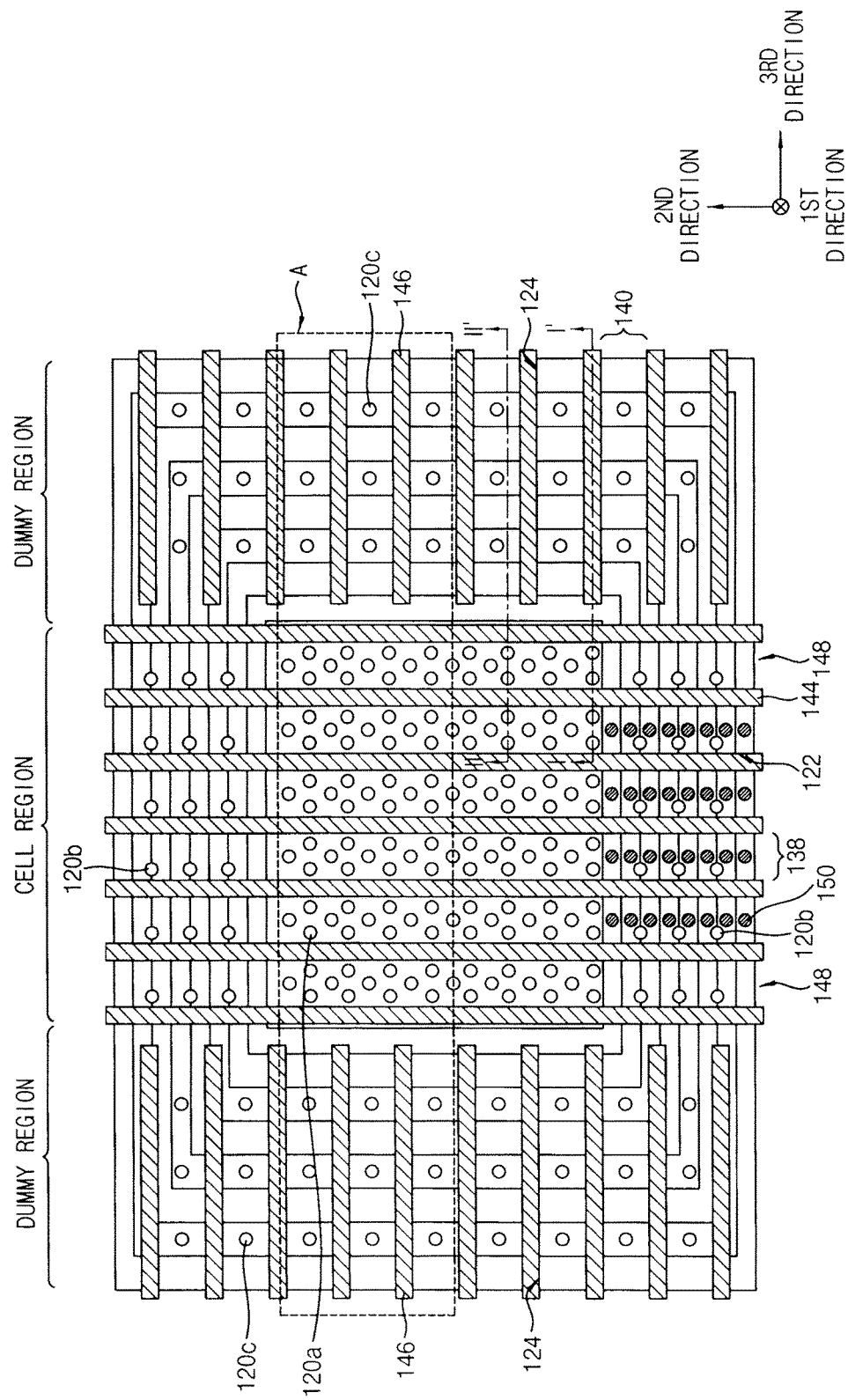
FIGS. 1 to 4 illustrate a top plan view, a perspective view and cross-sectional views of a semiconductor device in accordance with example embodiments.

Various example embodiments will be described more fully hereinafter with reference to the accompanying drawings, in which some example embodiments are shown. Example embodiments may, however, be embodied in many different forms and should not be construed as limited to those set forth herein. Rather, these example embodiments are provided so that this description will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
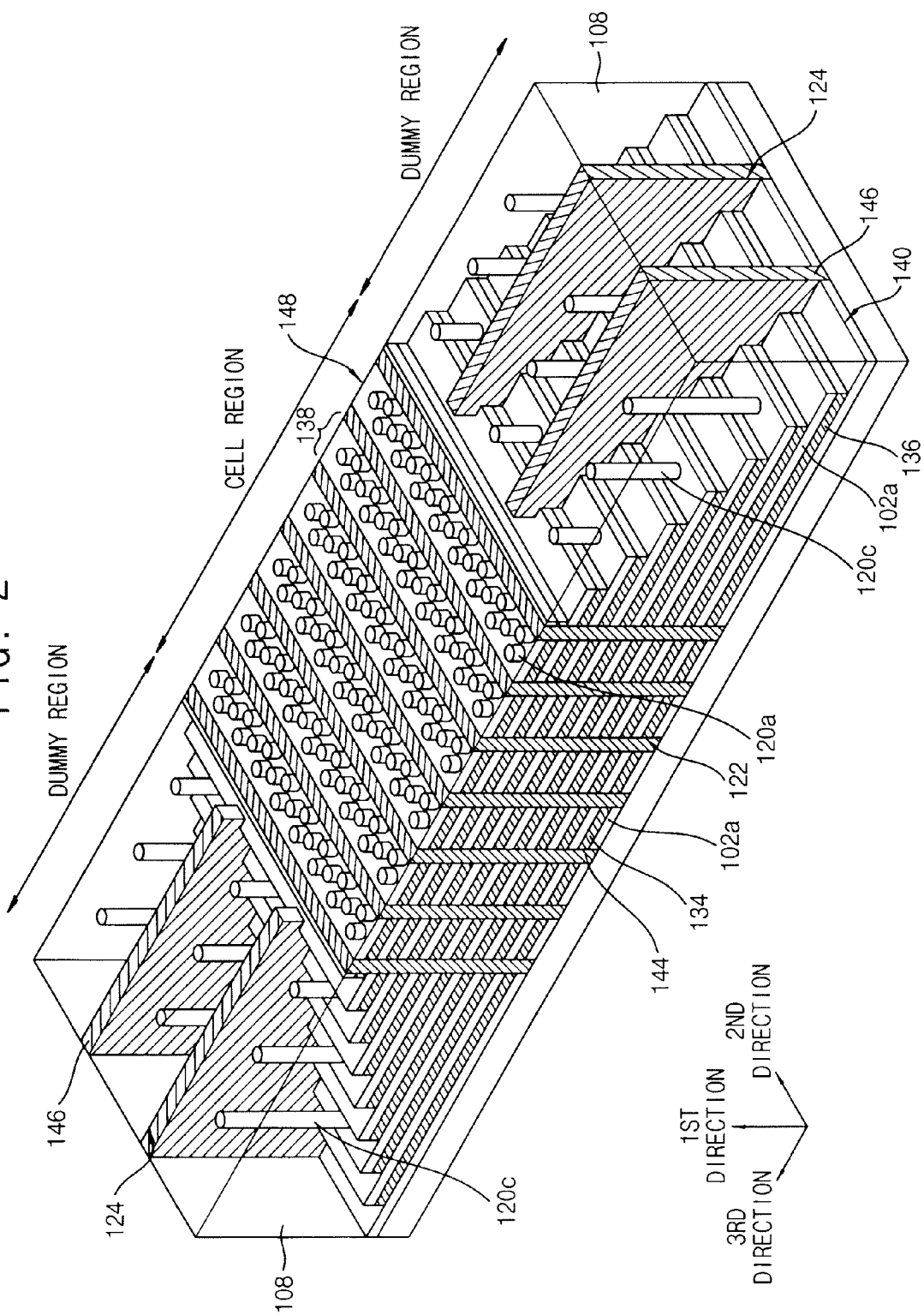
Figure 3:
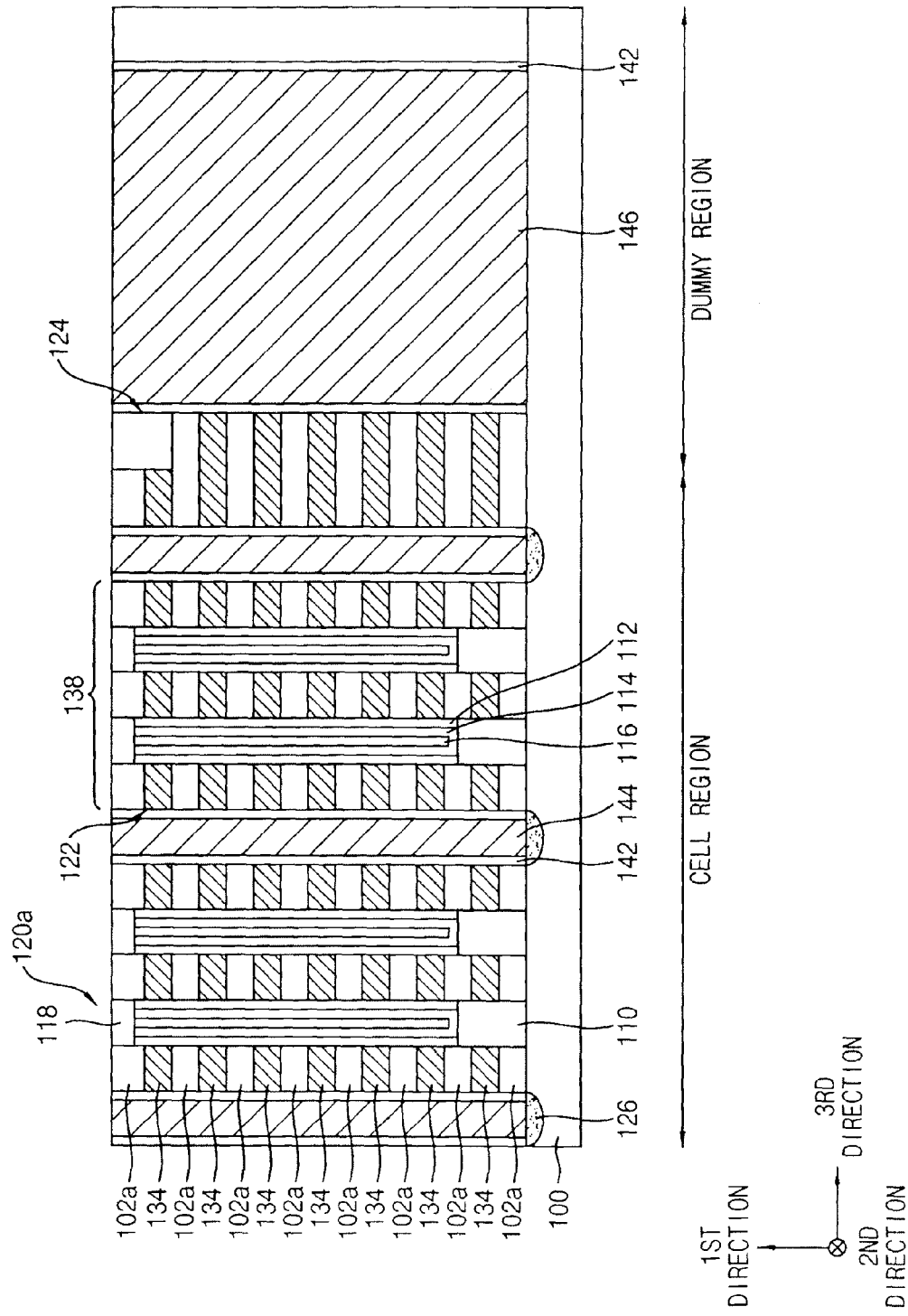
Figure 4:
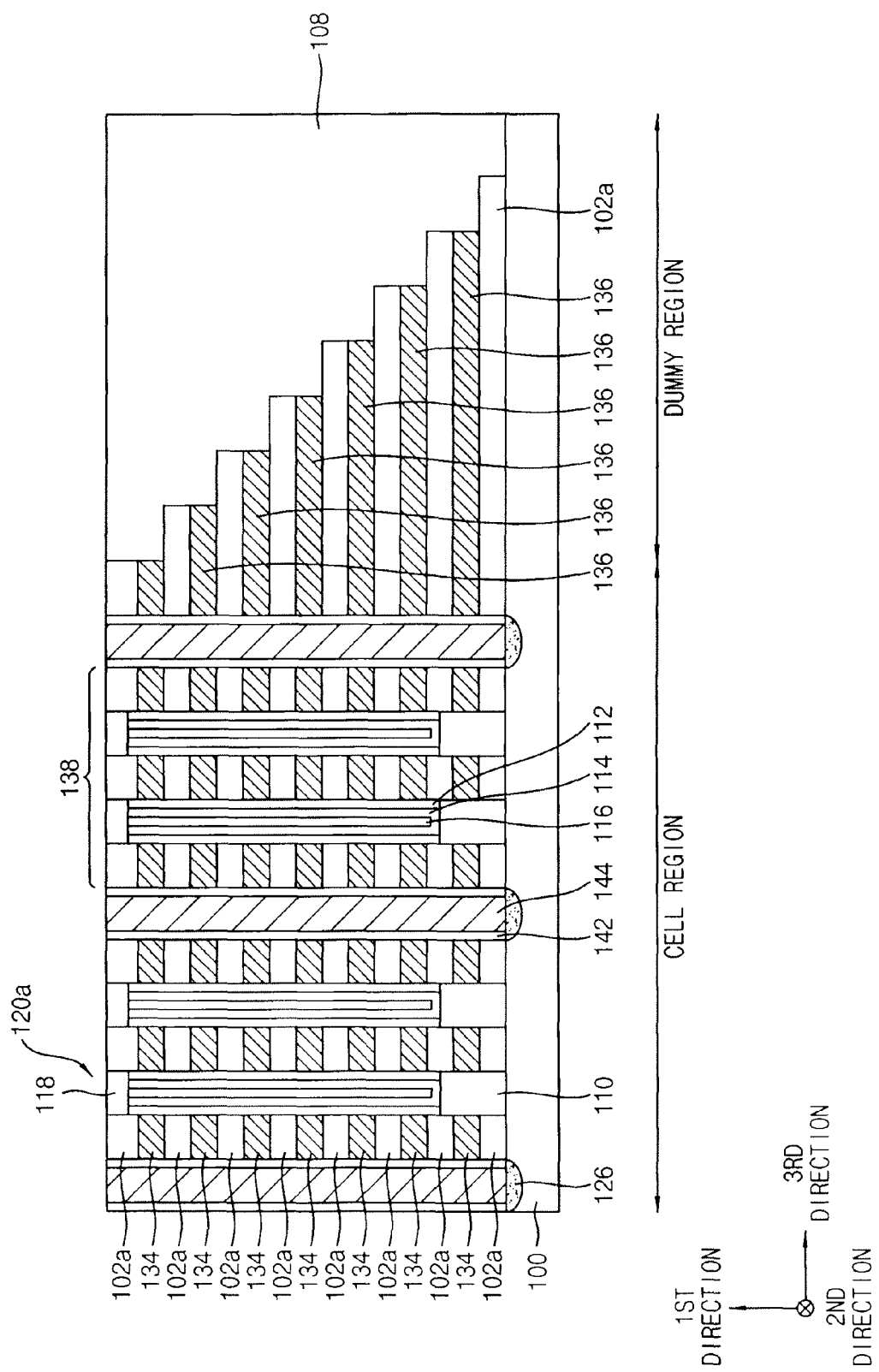

FIGS. 1 to 4 are a top plan view, a perspective view, and cross-sectional views illustrating a semiconductor device in accordance with example embodiments. Specifically, FIG. 2 is an enlarged perspective view of a portion "A" in FIG. 1. FIGS. 3 and 4 are cross-sectional views taken along lines I-I' and II-II' in FIG. 1, respectively.

In example embodiments, the semiconductor device may be a non-volatile vertical memory device. Memory cells included in the semiconductor device may be formed on a channel extending vertically, e.g., along a normal direction, with respect to a top surface of a substrate.

A direction substantially vertical to the top surface of the substrate is referred to as a first direction, and two directions substantially parallel to the top surface of the substrate and substantially crossing each other are referred to as a second direction and a third direction. For example, the second direction and the third direction are substantially perpendicular to each other. Additionally, a direction indicated by an arrow and a reverse direction thereof are considered as a same direction. The above mentioned definitions of the directions are the same throughout all the figures in this specification.

Referring to FIGS. 1 to 4, a semiconductor device may include a memory cell structure disposed on a cell region of a substrate 100, and a dummy structure disposed on a dummy region of the substrate 100. For example, the dummy region of the substrate 100 may be located at both ends of the cell region in the third direction.

The substrate 100 may include a semiconductor material, e.g., silicon (Si) or germanium (Ge).

The memory cell structure may include first and second channel structures 120a and 120b, gate lines 134, and a common source line (CSL) 144. The gate lines 134 may be formed on outer sidewalls of the first and second channel structures 120a and 120b. The gate lines 134 may extend in the second direction, and may be spaced apart from each other along the first direction. The CSL 144 may extend through the gate lines 134, and may extend in the second direction. The CSL 144 may serve as a cutting line intersecting the gate lines 134.

The first and second channel structures 120a and 120b may each include a semiconductor pattern 110, a channel layer 114 extending from a top surface of the semiconductor pattern 110 in the first direction, a dielectric layer structure 112 surrounding an outer sidewall of the channel layer 114, a filling pattern 116 in the channel layer 114, and a pad 118 disposed on the dielectric layer 112, the channel layer 114, and the filling pattern 116.

The semiconductor pattern 110 may include a semiconductor material, e.g., silicon or germanium. In some embodiments, the semiconductor pattern 110 may be omitted, and the channel layer 114 may be formed, e.g., directly, on the substrate 100.

The channel layer 114 may protrude vertically from a top surface of the substrate 100, and may have a hollow, e.g., cylindrical, shape or, e.g., a cup, shape. In an embodiment, the channel layer 114 may have, e.g., a solid cylindrical shape or a pillar shape. The channel layer 114 may include, e.g., polysilicon or single crystalline silicon. P-type impurities, e.g., boron (B), may be doped in a portion of the channel layer 114.

The dielectric layer structure 112 may be formed on the outer sidewall of the channel layer 114, and may have a substantial straw shape, e.g., the dielectric layer structure 112 may have a shape of a cylindrical shell surrounding the channel layer 114. In some embodiments, the dielectric layer structure 112 may include a tunnel insulation layer, a charge storage layer, and a blocking layer sequentially formed from the outer sidewall of the channel layer 114. For example, the dielectric layer structure 112 may have an oxide-nitride-oxide (ONO) layered structure.

The filling pattern 116 may include an insulation material, e.g., silicon oxide. If the channel layer 114 has a solid cylindrical shape or a pillar shape, the filling pattern 116 may be omitted.

Upper portions of the dielectric layer structure 112, the channel layer 114, and the filling pattern 116 may be capped or closed by the pad 118. The pad 118 may include, e.g., polysilicon or single crystalline silicon, and may further include, e.g., n-type impurities, e.g., phosphorous (P) or arsenic (As).

In example embodiments, the first channel structures 120a may be arranged along the second direction to form a channel column, e.g., a plurality of the first channel structures 120a may be arranged in an array along the second direction. A plurality of the channel columns may be arranged along the third direction, e.g., the channel columns may be spaced apart from each other along the third direction with the CSL 144 therebetween.

The gate lines 134 may surround the first channel structure 120a and may extend in the second direction. In example embodiments, the gate lines 134 may surround the plurality of the channel columns arranged along the third direction.

The gate lines 134 may include a metal having a low electrical resistance or a nitride thereof. For example, the gate line 134 may include tungsten (W), tungsten nitride, titanium (Ti), titanium nitride, tantalum (Ta), tantalum nitride, platinum (Pt), or the like.

In example embodiments, a lowermost gate line of the gate lines 134 may serve as a ground selection line (GSL), and an uppermost gate line of the gate lines 134 may serve as a string selection line (SSL). The gate lines 134 between the GSL and the SSL may serve as word lines. The number of levels of the GSL, the word lines, and the SSL may be properly adjusted in consideration of a circuit design and a degree of integration of the semiconductor device.

An insulating interlayer pattern 102a may be interposed at each level between the gate lines 134. The insulating interlayer pattern 102a may include, e.g., a silicon oxide-based material.

The insulating interlayer patterns 102a and the gate lines 134 may be alternately stacked along the first direction such that a first structure 138 may be defined. The first structure 138 may extend in the second direction. Both lateral portions of the first structure 138 in the second direction may serve as a wiring region and have a stepped shape. Thus, different wirings may be connected to different gate lines 134 included in the first structure 138 so that an electrical signal may be individually applied to each gate line 134.

A central portion of the first structure 138 which may not have the stepped shape may serve as a main cell region, and the lateral portion having the stepped shape may serve as the wiring region. The wirings may include contact plugs 150 that may be in contact with gate lines 134, and conductive lines electrically connected to the contact plugs 150.

The first channel structure 120a may be disposed on the main cell region, and may be provided as a portion of a memory cell. The second channel structure 120b may be disposed on the wiring region, and may not be provided as the portion of the memory cell. The second channel structure 120b may serve as a supporting pillar for the lateral portion of the first structure 138.

A plurality of the second channel structures 120b may not be in contact with the wirings, or may be spaced apart from the wirings. The second channel structures 120b may have an arrangement different from that of the first channel structures 120a. In example embodiments, a density in a unit area of the second channel structures 120b may be less than that of the first channel structures 120a.

A first opening 122 may be formed between the first structures 138 neighboring each other. The first opening 122 may extend in the second direction. The first opening 122 may extend through the alternating stack of insulating interlayer patterns 102a and the gate lines 134 to the top surface of the substrate 100. An insulation pattern 142 may be formed on a sidewall of the first opening 122 (FIG. 3). The gate lines 134 and the CSL 144 may be insulated from each other by the insulation pattern 142. An impurity region 126 may be formed at an upper portion of the substrate 100 which may be exposed through the first opening 122.

The CSL 144 may be in the first opening 122 and may be in contact with the impurity region 126. The CSL 144 may extend in the second direction. The CSL 144 may include a metal having a low resistance, e.g., W, Ti, Ta, Pt, etc., or a nitride thereof.

The dummy structure disposed on the dummy region may include a second structure 140 and a dummy source line 146. A plurality of the second structures 140 may be arranged and spaced apart from each other along the second direction. A plurality of the dummy source lines 146 may extend between the neighboring second structures 140.

The second structure 140 may include the insulating interlayer patterns 102a and dummy patterns 136 which may be alternately stacked. The second structure 140 may extend in a direction that may be different from the second direction, e.g., the second structure 140 may extend in the third direction.

The insulating interlayer pattern 102a included in the second structure 140 may be the same as the insulating interlayer pattern 102a of the first structure 138. The dummy patterns 136 included in the second structure 140 may be formed at levels corresponding to the gate lines 134 of the first structure 138.

At least a portion of the dummy patterns 136 may include the same conductive material as that of the gate lines 134. In example embodiments, a width in the second direction of the second structure 140 may be substantially the same as a width in the third direction of the first structure 138. The second structure 140 may have a stepped structure along the third direction.

A second opening 124 may be formed between neighboring second structures 140. The second opening 124 may extend in a direction different from the second direction. The second opening 124 may extend to the top surface of the substrate 100. In example embodiments, the second opening 124 may extend in the third direction, and a plurality of the second openings 124 may be formed to be spaced apart from each other along the second direction. In example embodiments, a width in the second direction of the second opening 124 may be equal to or greater than a width in the third direction of the first opening 122.

An impurity region may be formed at an upper portion of the substrate 100 exposed through the second opening 124. The impurity region under the second opening 124 may be formed together with the impurity region 126 under the first opening 122 of the cell region. However, the impurity region under the second opening 124 may not participate in any electrical operation.

The insulation pattern 142 may be formed on a sidewall of the second opening 124. The dummy pattern 136 and the dummy source line 146 may be insulated from each other by the insulation pattern 142.

The dummy source line 146 may be disposed in the second opening 124, and may be in contact with the top surface of the substrate 100. The dummy source line 146 may extend in the third direction. The dummy source line 146 may include a conductive material substantially the same as that of the CSL 144.

A third channel structure 120c having a construction substantially the same as that of the first channel structure 120a may be disposed on the dummy region. The third channel structure 120c may not serve as a channel of the memory cell, and may merely serve as a supporting pillar of the second structure 140. A plurality of the third channel structures 120c may be provided in an arrangement different from those of the first channel structures 120a and/or the second channel structures 120b. In example embodiments, a density in a unit area of the third channel structures 120c may be less than that of the first channel structures 120a.

In example embodiments, memory cells defined at both ends in the third direction on the cell region may be dummy cells 148 that may not participate in an actual operation. Thus, wirings for applying a signal may not be connected to the dummy cells 148.

As the degree of integration of the semiconductor device becomes higher, the stacked number of the gate lines 134 and the insulating interlayer patterns 102a may also become greater. Thus, aspect ratios of the first and second structures 138 and 140 may be increased. Accordingly, a bending or a collapse of the first and second structures 138 and 140 may be caused due to a stress imposed thereon. For example, the second structure 140 and end portions of the first structure 138 may be more vulnerable to the bending or the collapse because shrinkage and release of the structures may be irregularly repeated by the stress.

However, according to example embodiments, the first opening 122 and the second opening 124 may extend in different direction, and thus stress orientations imposed on the first and second structures 138 and 140 may be different. Therefore, a stress imposed on the first structure 138 while forming the first opening 122 may be reduced.

At least a portion of the dummy patterns 136 may include the same conductive material as that of the gate lines 134. The dummy patterns 136 may not include a nitride that may be a significant source of stress, or a portion including the nitride may be reduced. Thus, the stress imposed on the first structure 138 may be reduced. Therefore, the bending or the collapse of the first and second structures 138 and 140 may be suppressed.

Figure 6:
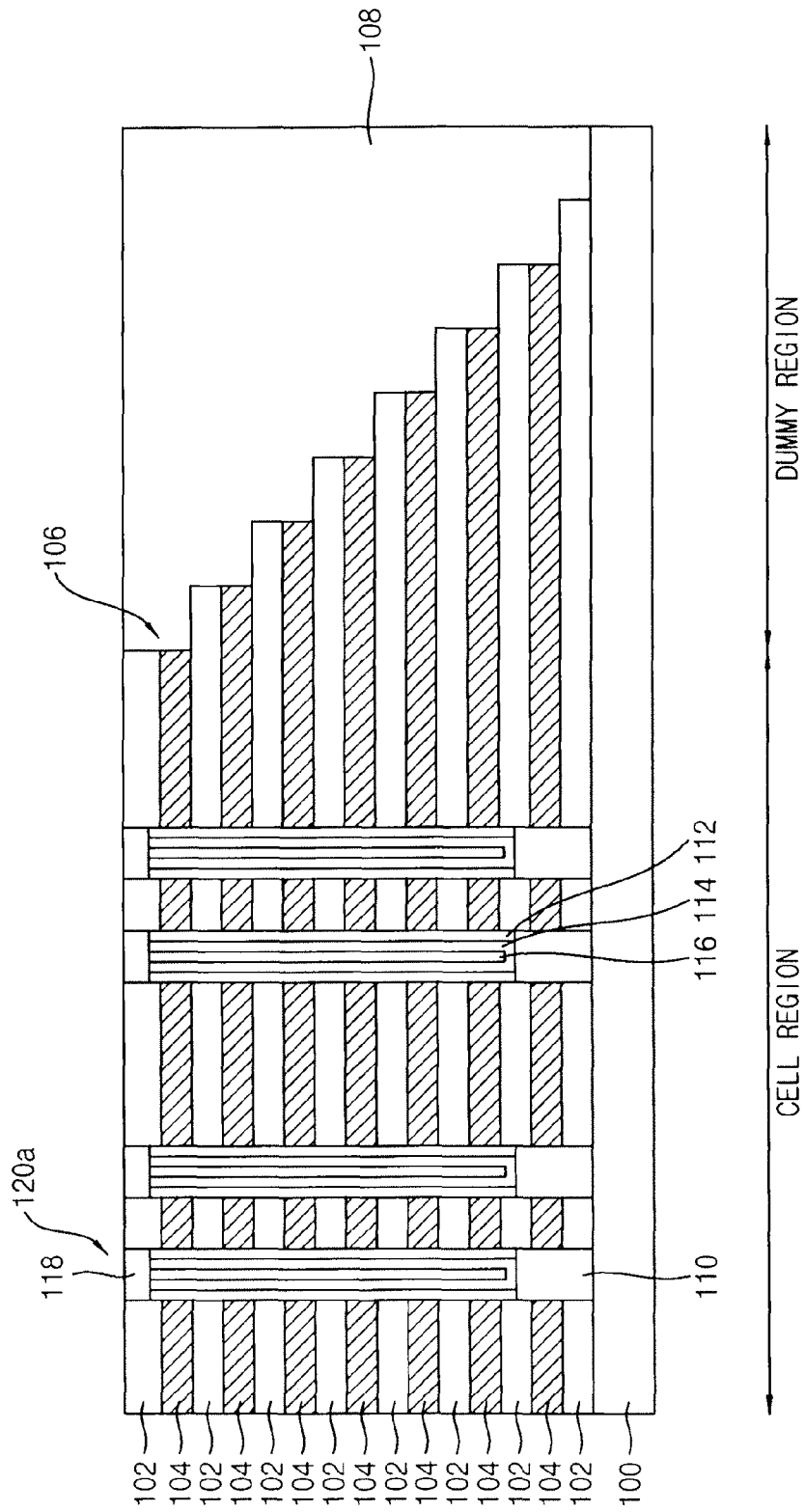
Figure 7:
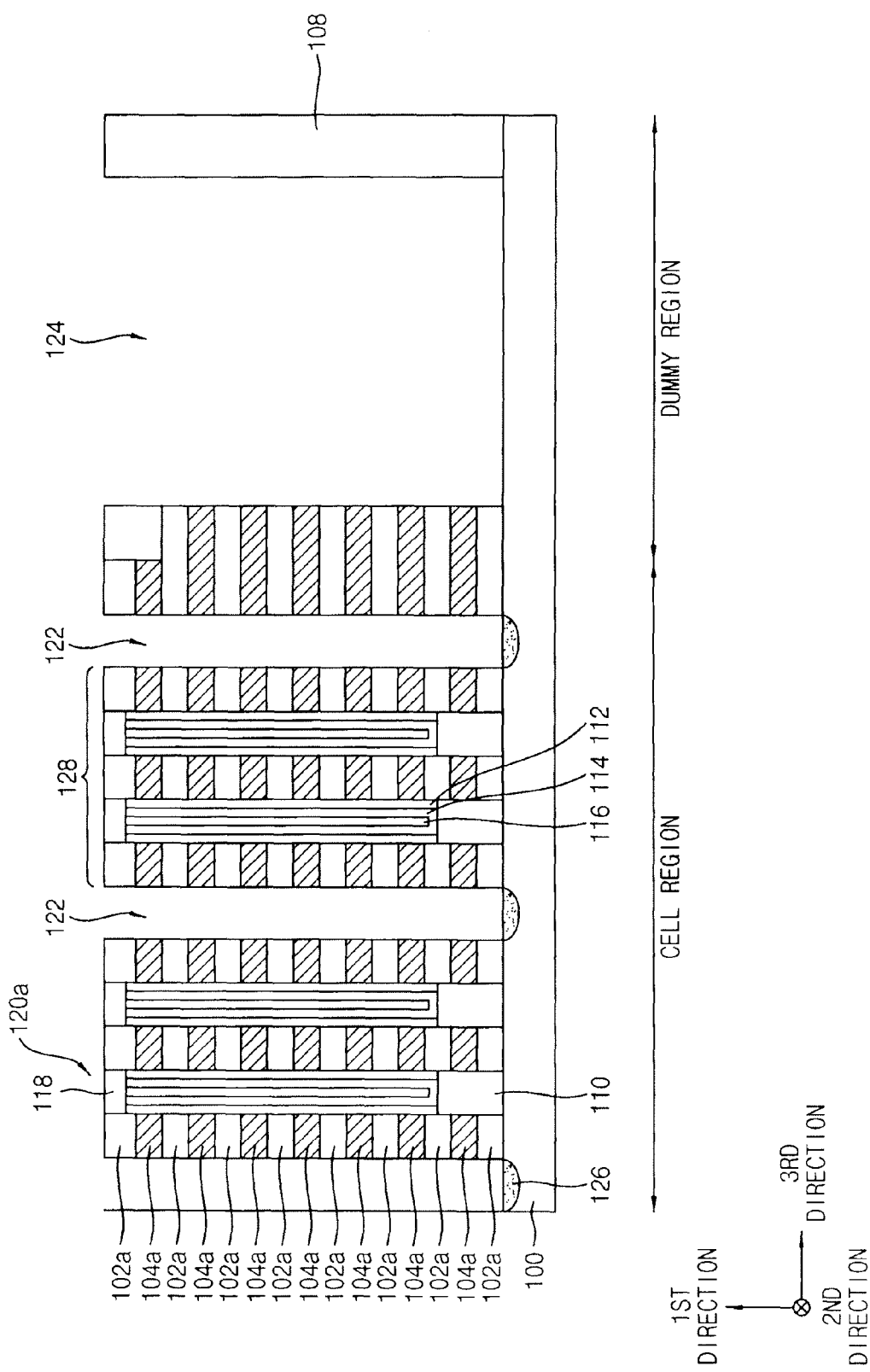
Figure 8:
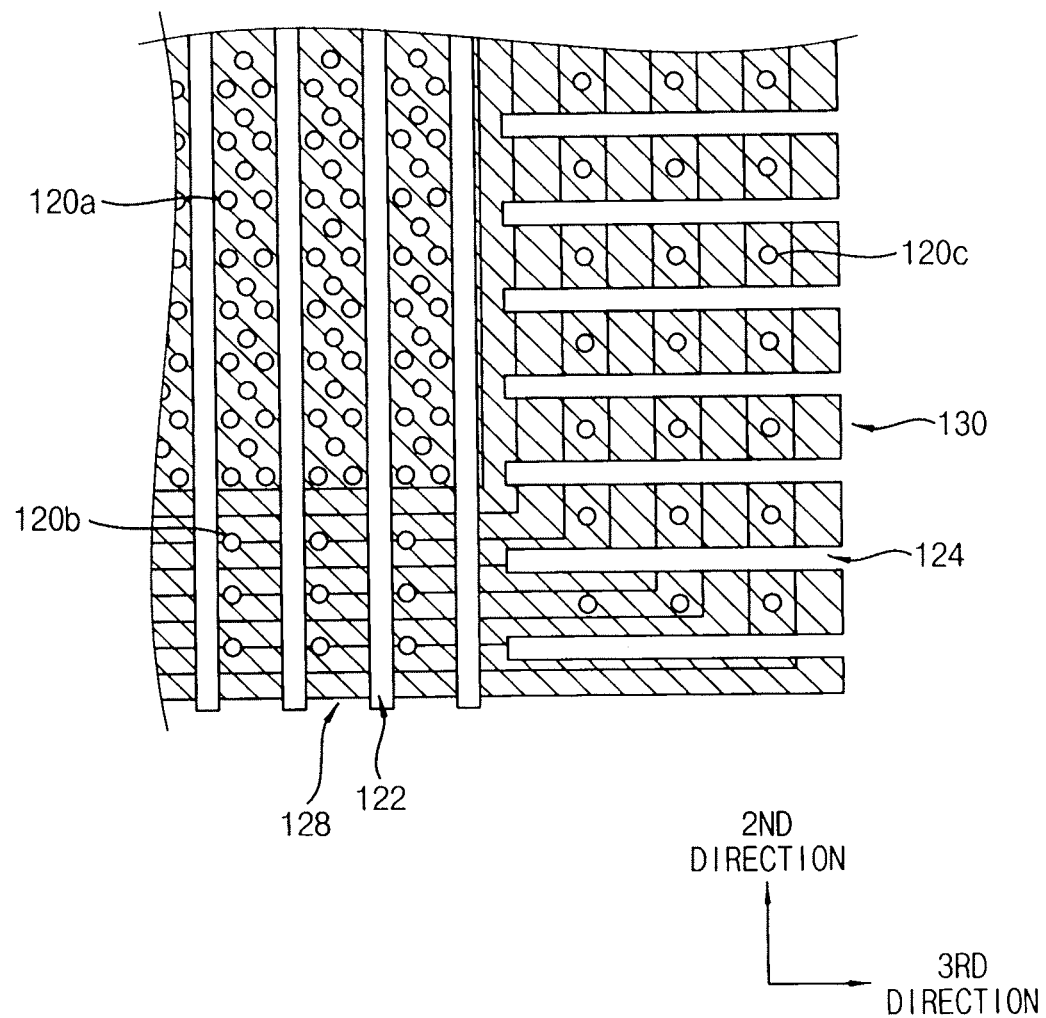
Figure 9:
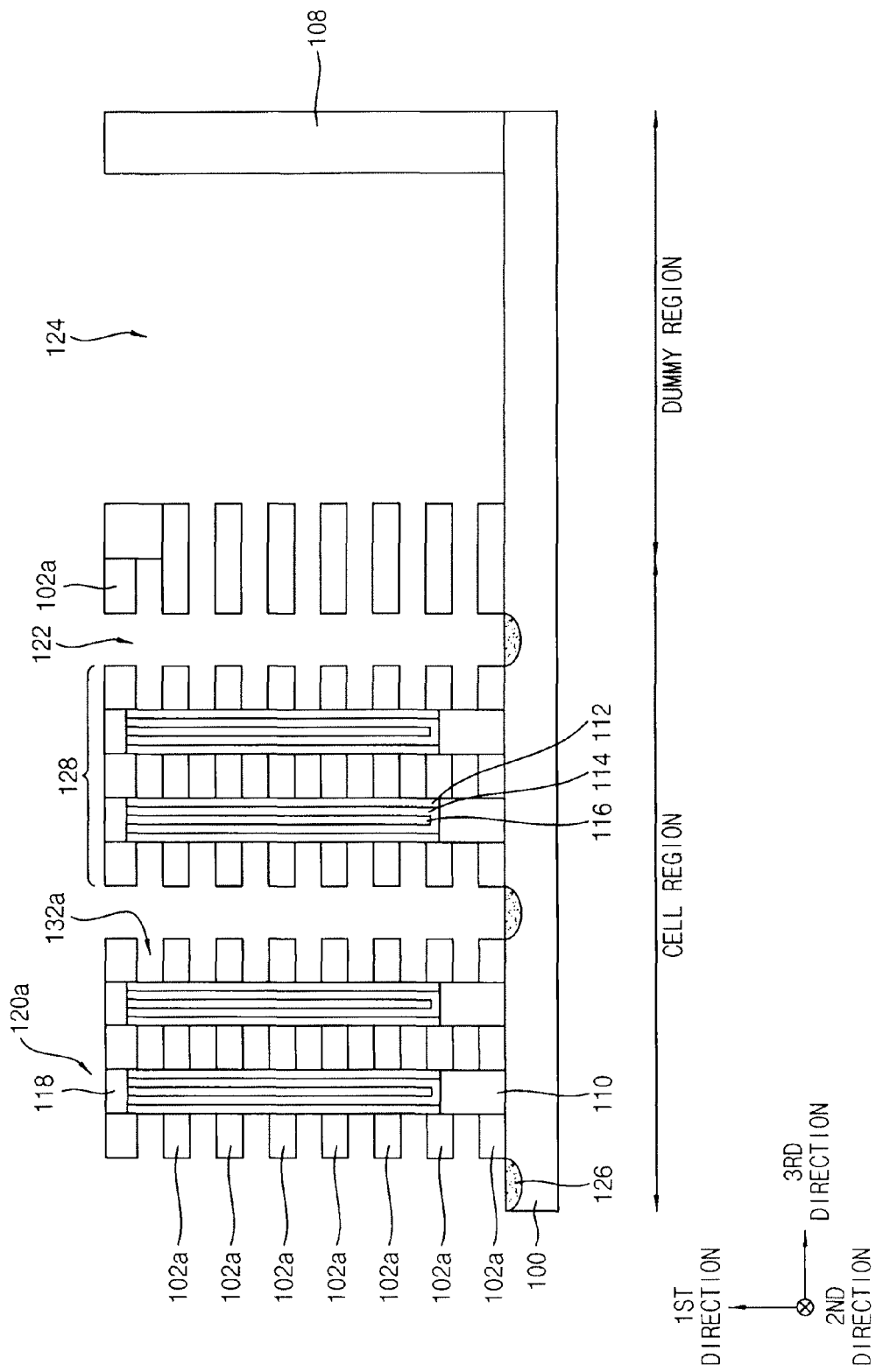
Figure 10:
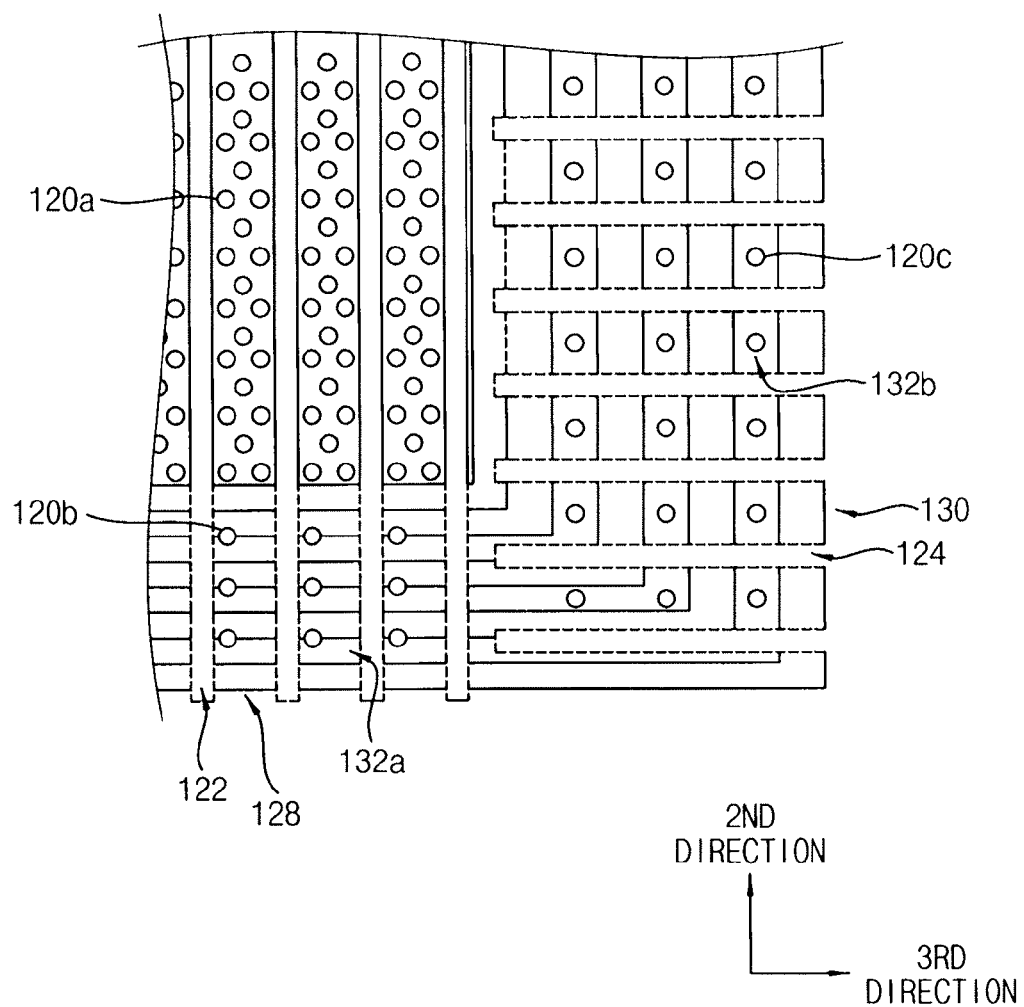
Figure 11:
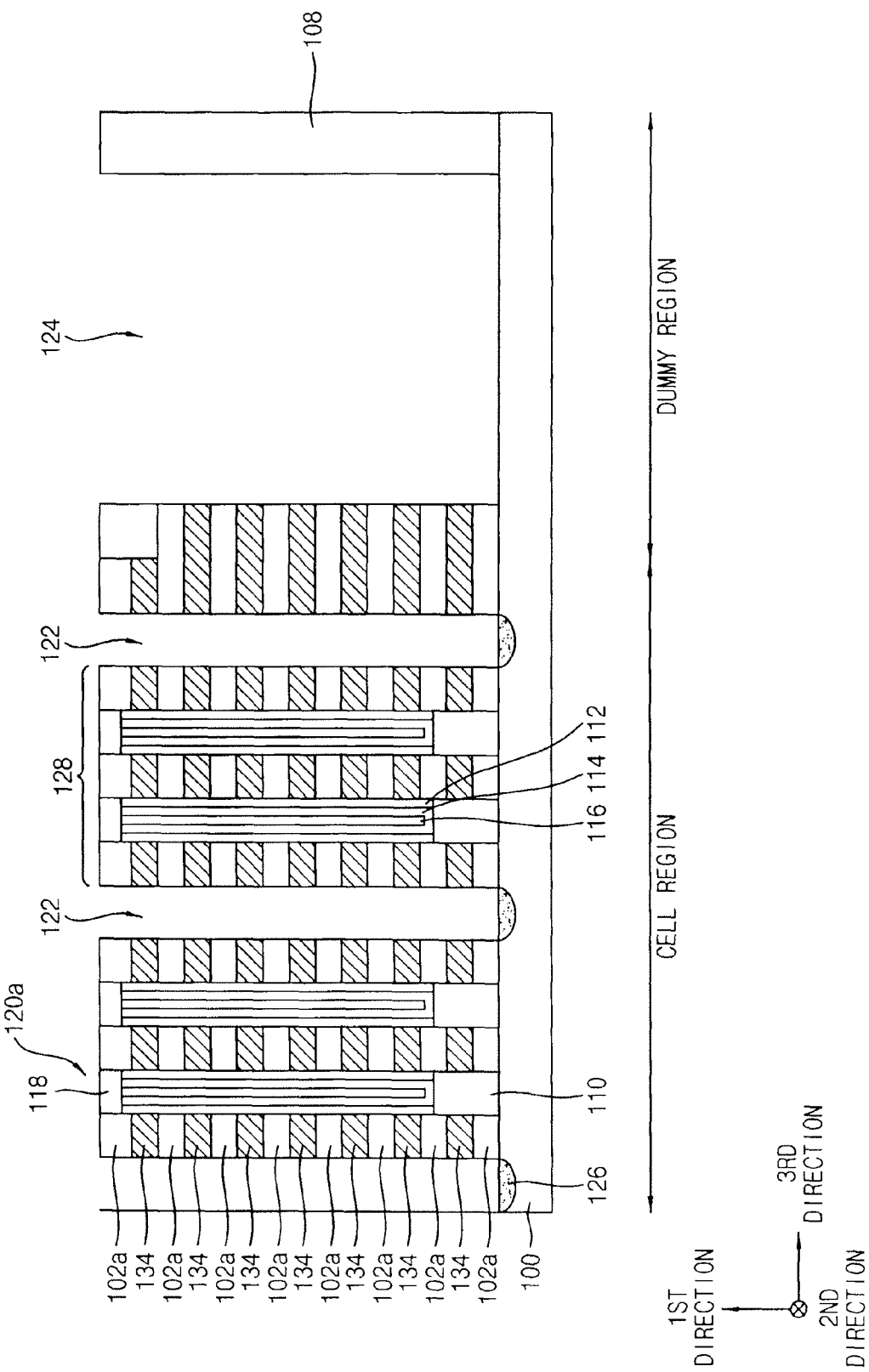
Figure 12:
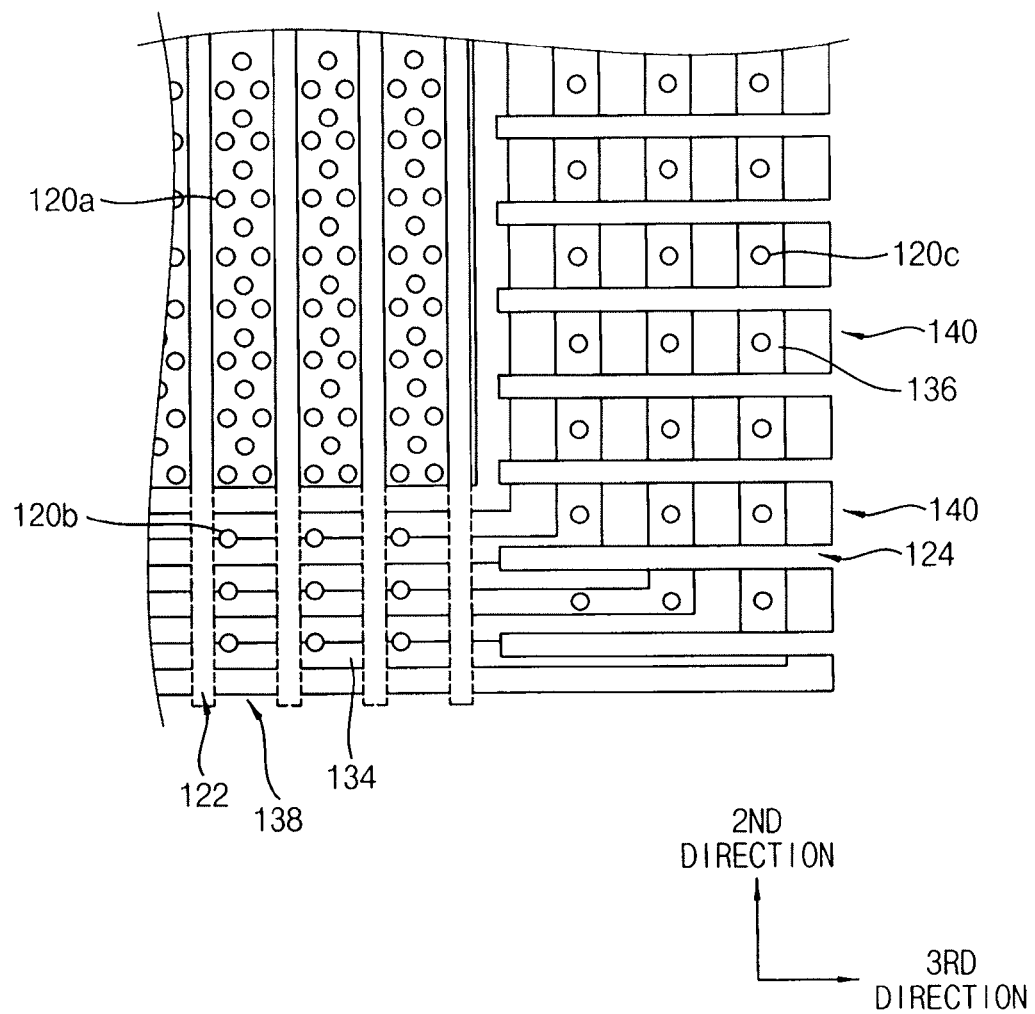

FIGS. 5 to 13 are cross-sectional views and top plan views illustrating stages in a method of manufacturing a semiconductor device in accordance with example embodiments. For example, FIGS. 5 to 7, 9, 11 and 13 are cross-sectional views illustrating stages in a method of manufacturing the semiconductor device of FIGS. 1 to 4. FIGS. 8, 10 and 12 are enlarged top plan views illustrating the stages in the method. Specifically, FIGS. 5 to 7, 9, 11 and 13 are taken along the line I-I' indicated in FIG. 1.

Figure 5:
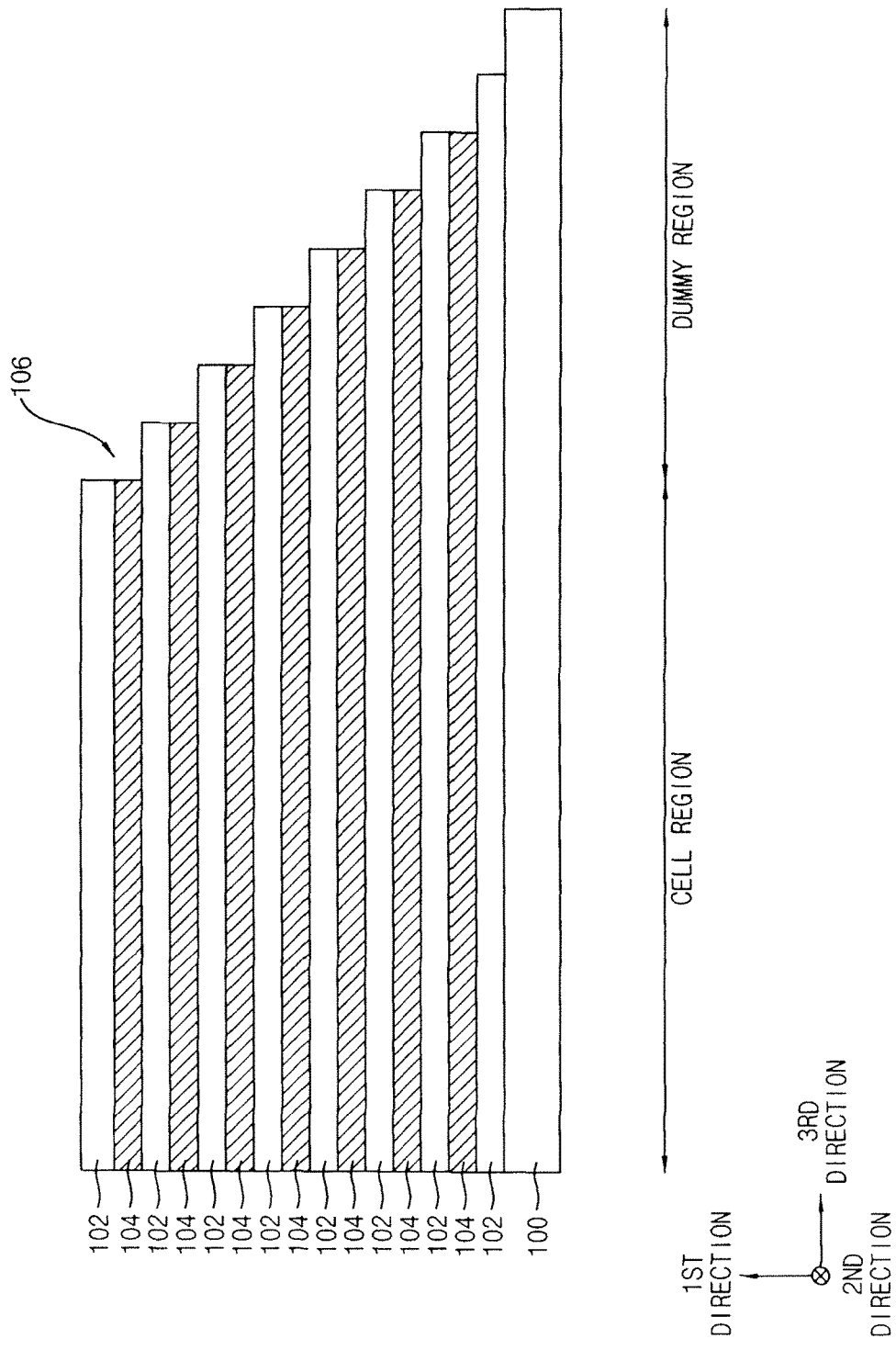
FIGS. 5 to 13 illustrate cross-sectional views and top plan views of a method of manufacturing a semiconductor device in accordance with example embodiments.

Referring to FIG. 5, the insulating interlayers 102 and the sacrificial layers 104 may be alternately and repeatedly formed on the substrate 100, which includes a cell region and a dummy region. The insulating interlayers 102 and the sacrificial layers 104 may be partially removed to form a mold structure 106. End portion of the mold structure 106 in the second and third directions may have stepped structures. The dummy region may be adjacent to an end portion of the cell region in the third direction.

In example embodiments, the insulating interlayer 102 may be formed of an oxide-based material, e.g., silicon dioxide, silicon oxycarbide and/or silicon oxyfluoride. The sacrificial layer 104 may be formed of a material that may have an etching selectivity with respect to the insulating interlayer 102 and may be easily removed by a wet etching process. For example, the sacrificial layer 104 may be formed of a nitride-based material, e.g., silicon nitride and/or silicon boronitride.

The sacrificial layers 104 may be removed by a subsequent process to provide spaces for gate lines. Thus, the number of the insulating interlayers 102 and the sacrificial layers 104 may be determined in consideration of the number of the gate lines.

For example, a photoresist pattern may be formed on an uppermost insulating interlayer 102 such that end portions of the uppermost insulating interlayer 102 may be exposed. End portions of the insulating interlayers 102 and the sacrificial layers 104 may be etched using the photoresist pattern as an etching mask. End portions of the photoresist pattern may then be removed so that a width of the photoresist pattern may be reduced. Next, the insulating interlayers 102 and the sacrificial layers 104 may be etched using the photoresist pattern as the etching mask again. Etching processes may be repeated in a similar manner as described above to obtain the mold structure 106.

A portion of the mold structure 106 on the dummy region may have a stepped structure along the third direction. A portion of the mold structure 106 on the cell region may include stepped structures at both end portions in the second direction.

Referring to FIG. 6, a lower insulation layer 108 covering lateral portions of the mold structure 106 may be formed on the substrate 100. First, second and third channel structures may be formed through the mold structure 106 and the lower insulation layer 108

In example embodiments, an insulation layer covering the mold structure 106 may be formed on the substrate 100. The insulation layer may be formed of, e.g. silicon oxide by a chemical vapor deposition (CVD) process, a spin coating process, etc. An upper portion of the insulation layer may be planarized by a chemical mechanical polish (CMP) process and/or an etch-back process until the uppermost insulating interlayer 102 is exposed to form the lower insulation layer 108. The lower insulation layer 108 may cover the stepped structures at the end portions of the mold structure 106. In example embodiments, the lower insulation layer 108 may include an insulation material substantially the same as or similar to that of the insulating interlayer 102.

The mold structure 106 and/or the lower insulation layers 108 may be partially etched along the first direction to form the first to third channel holes. For example, a hard mask may be formed on the uppermost insulating interlayer 102 and the lower insulation layer 108. The mold structure 106 and the lower insulation layer 108 may be partially removed by, e.g., a dry etching process through the hard mask to form the first to third channel holes.

The first and second channel holes may be formed through the mold structure 106 on the cell region, and the third channel hole may be formed through the mold structure on the dummy region. In example embodiments, a plurality of the first channel holes may be formed through a central portion of the mold structure 106 (e.g., on a main cell region) that may not have the stepped structure. The first channel holes may be formed along the second and third directions regularly. The second channel holes may be formed through the stepped structure in the second direction of the mold structure 106 (e.g., on a wiring region).

In example embodiments, the second channel holes may be formed in an arrangement different from that of the first channel holes. In example embodiments, the third channel holes may be formed in an arrangement different from those of the first channel holes and/or the second channel holes.

Each of the second and third channel holes may have a size the same as or different from that of the first channel hole. The second and third channel holes formed at the end portions of the mold structure 106 may not extend to the substrate 100 due to an etching loading to cause a not-open defect. In some embodiments, the size of the second channel hole and/or the third channel hole may be increased relatively to the size of the first channel hole so that the not-open defect may be avoided.

A silicon epitaxial growth process may be performed from the substrate 100 exposed through the first to third channel holes so that semiconductor patterns 110 may be formed at lower portions of the first to third channel holes. In some embodiments, the formation of the semiconductor pattern 110 may be omitted.

A dielectric layer may be formed along sidewalls and bottoms of the first to third channel holes, the uppermost insulating interlayer 102 and the lower insulation layer 108. In example embodiments, the dielectric layer may be formed by sequentially forming a blocking layer, a charge storage layer and a tunnel insulation layer. For example, the blocking layer may be formed using an oxide, e.g., silicon oxide, the charge storage layer may be formed using silicon nitride or a metal oxide, and the tunnel insulation layer may be formed using an oxide, e.g., silicon oxide. In example embodiments, the dielectric layer may be formed as an oxide-nitride-oxide (ONO) layered structure. The blocking layer, the charge storage layer, and the tunnel insulation layer may be formed by a CVD process, a plasma-enhanced chemical vapor deposition (PECVD) process, an atomic layer deposition (ALD) process, etc.

Portions of the dielectric layer formed on the bottoms of the first to third channel holes may be removed by, e.g., an etch-back process so that a top surface of the semiconductor pattern 110 may be exposed. Thus, the dielectric layer structure 112 may be formed on each sidewall of the first to third channel holes. The dielectric layer structure 112 may have a substantial straw shape.

The channel layer 114 may be formed conformally on the uppermost insulating interlayer 102, the dielectric layer structure 112, and the semiconductor pattern 110, and the filling pattern 116 filling remaining portions of the first to third channel holes may be formed. In example embodiments, the channel layer 114 may be formed of polysilicon or amorphous silicon optionally doped with impurities. In some embodiments, the channel layer 114 may sufficiently fill the first to third channel holes. In this case, the formation of the filling pattern 116 may be omitted.

Upper portions of the dielectric layer structure 112, the channel layer 114, and the filling pattern 116 may be removed by an etch-back process to form recesses. A pad layer sufficiently filling the recesses may be formed on the uppermost insulating interlayer 102 and the lower insulation layer 108. An upper portion of the pad layer may be planarized until top surfaces of the uppermost insulating interlayer 102 and/or the lower layer 108 may be exposed to form pads 118 from remaining portions of the pad layer. In example embodiments, the pad layer may be formed using, e.g., polysilicon optionally doped with n-type impurities. The planarization process may include a CMP process and/or an etch-back process.

After performing the aforementioned processes, the first channel structure 120a, the second channel structure 120b, and the third channel structure (also see FIG. 1) may be formed in the first channel hole, the second channel hole, and the third channel hole, respectively. In example embodiments, the plurality of the first channel structures 120a may be formed through the mold structure 106 on the main cell region, the plurality of the second channel structures 120b may be formed through the mold structure 106 on the wiring region, and the plurality of the third channel structures 120c may be formed through the mold structure 106 on the dummy region.

The first to third channel structures 120a, 120b, and 120c may have substantially the same construction, while only the first channel structures 120a are illustrated in FIG. 6. The first channel structures 120a may substantially serve as a portion of the memory cells. The second and third channel structures 120b and 120c may serve as pillars supporting both portions of the mold structure 106.

Referring to FIGS. 7 and 8, the mold structure 106 and the lower insulation layer 108 may be anisotropically etched to form the first openings 122 on the cell region, and the second openings 124 on the dummy region. The top surface of the substrate 100 may be exposed through bottoms of the first and second openings 122 and 124.

As illustrated in FIG. 8, the first openings 122 may extend in the second direction. The mold structure 106 may be cut or intersected by the first openings 122 along the second direction to form first mold structures 128 spaced apart from each other along the third direction. The first mold structure 128 may surround the plurality of the first channel structures 120a, and extend in the second direction.

The second openings 124 may extend in a direction different from the second direction, e.g., the second opening 124 may extend in the third direction (FIG. 8). The mold structure 106 may be cut or intersected by the second openings 124 along the third direction to form second mold structures 130 spaced apart from each other along the second direction.

In example embodiments, a width in the third direction of the first opening 122 may be substantially the same as a width in the second direction of the second opening 124. In example embodiments, a distance between the first openings 122 neighboring in the third direction may be substantially the same as a distance between the second openings 124 neighboring in the second direction. For example, a width in the second direction of the second mold structure 130 may be substantially the same as a width in the third direction of the first mold structure 128.

The first and second mold structures 128 and 130 may include insulating interlayer patterns 102a and sacrificial patterns 104a alternately stacked. Both ends of the first mold structure 128 in the second direction may have stepped structures in the second direction. The second mold structure 130 may include a stepped structure in the third direction.

Etching directions and/or extending directions of the first and second openings 122 and 124 may be different so that a stress generated during the etching process for forming the first mold structures 128 may be reduced or mitigated. Thus, defects, e.g., bending of the first mold structure 128, may be avoided.

Impurities may be implanted through the first and second openings 122 and 124 to form impurity regions 126. The impurities may be n-type impurities, e.g., P or As.

Referring to FIGS. 9 and 10, the sacrificial patterns 104a exposed through the first and second openings 122 and 124 may be removed to form first gaps 132a and second gaps 132b. In example embodiments, the sacrificial patterns 104a may be removed by a wet etching process using, e.g., phosphoric acid and/or sulfuric acid as an etchant solution.

In example embodiments, the sacrificial patterns 104a formed on the cell region may be fully removed. The sacrificial patterns 104a formed on the dummy region may be fully or partially removed. For example, if the distance between the first openings 122 neighboring in the third direction is substantially the same as the distance between the second openings 124 neighboring in the second direction, the sacrificial patterns 104a formed on the dummy region may be fully removed.

The first gaps 132a may be formed at spaces from which the sacrificial patterns 104a of the cell region are removed. The second gaps 132b may be formed at spaces from which the sacrificial patterns 104a of the dummy region may be removed. Sidewalls of the first channel structures 120a may be partially exposed by the first gap 132a.

Referring to FIGS. 11 and 12, gate lines 134 may be formed in the first gaps 132a, and dummy patterns 136 may be formed in the second gaps 132b. In example embodiments, a gate electrode layer sufficiently filling the first and second gaps 132a and 132b may be formed. The gate electrode layer may also partially fill the first and second openings 122 and 124, and may be also formed on upper surfaces of the first and second mold structure 128 and 130.

The gate electrode layer may be formed using a metal or a metal nitride having low electrical resistance and work function. For example, the gate electrode layer may be formed of tungsten, tungsten nitride, titanium, titanium nitride, tantalum, tantalum nitride, platinum, etc. In an embodiment, the gate electrode layer may be formed as a multi-layered structure including a barrier layer formed of a metal nitride, and a metal layer.

Portions of the gate electrode layer formed in the first and second openings 122 and 124, and formed on the upper surfaces of the first and second mold structures 128 and 130 may be removed. Accordingly, the gate line 134 may be formed in the first gap 132a at each level, and the dummy pattern 136 may be formed in the second gap 132b at each level.

After performing the aforementioned processes, a first structure 138 including the insulating interlayer patterns 102a and the gate lines 134, and extending in the second direction may be formed on the cell region. Both end portions in the second direction of the first structure 138 may have a stepped structure. The second structure 140 including the insulating interlayer patterns 102a and the dummy patterns 136, and extending in the third direction may be formed on the dummy region.

As described above, the sacrificial patterns 104a included in the second mold structure 130 may be replaced with the dummy patterns 136. Thus, the second structure 140 may not include the sacrificial patterns 104a formed of a nitride generating a stress. Therefore, a stress transferred to the first structure 138 may be reduced so that a structural stability of the first structure 138 may be improved.

Figure 13:
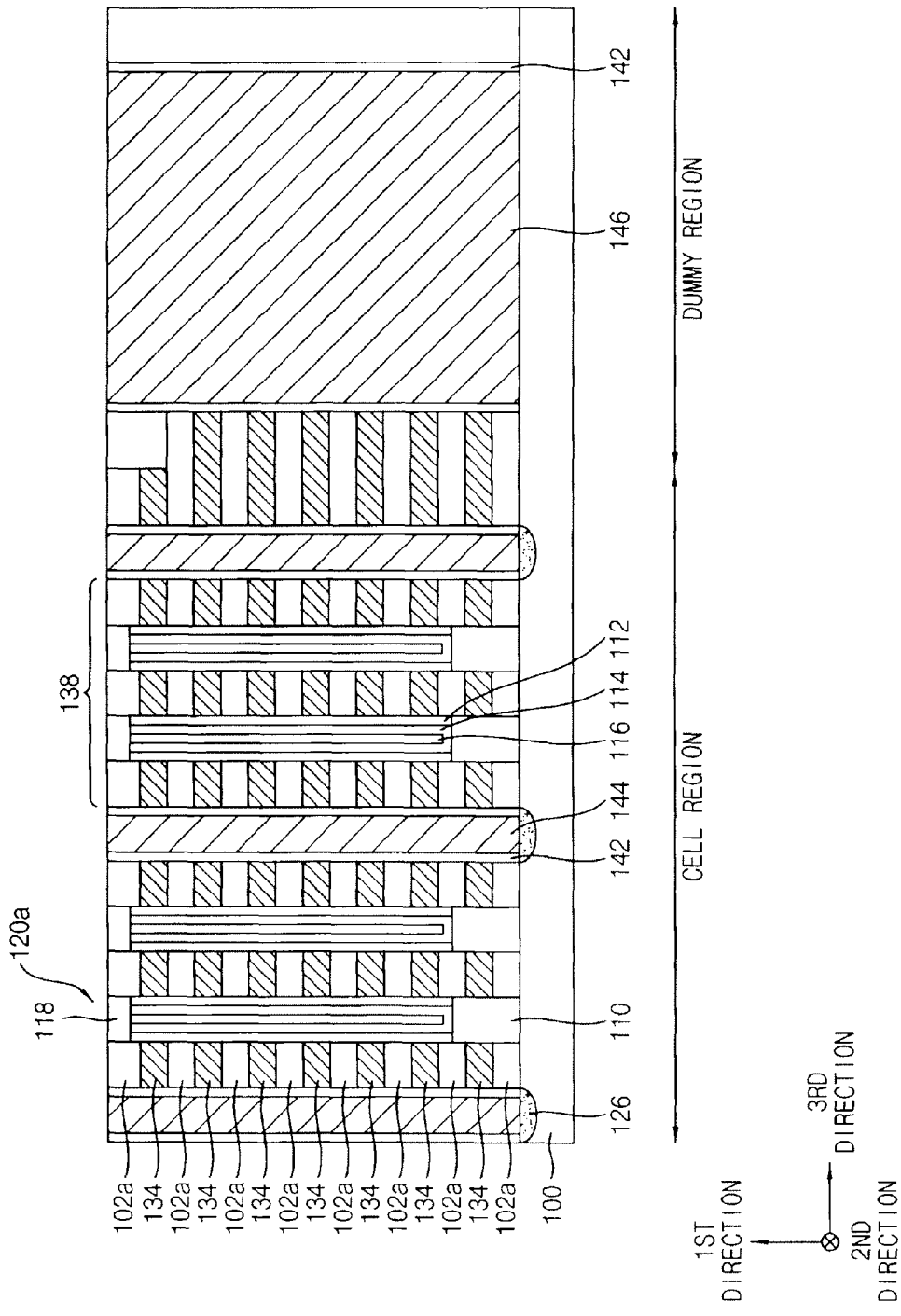

Referring to FIG. 13, the insulation patterns 142 may be formed on sidewalls of the first and second openings 122 and 124. The CSL 144 and the dummy source line 146 filling the first opening 122 and the second opening 124, respectively, may be formed.

In example embodiments, an insulation layer may be formed conformally on sidewalls and bottoms of the first and second openings 122 and 124, and on upper surfaces of the first structure 138, the second structure 140, and the lower insulation layer 108. Portions of the insulation layer formed on the bottoms of the first and second openings 122 and 124, and on the upper surfaces of the first and second structures 138 and 140 may be removed by, e.g., an anisotropic etching process. Thus, the insulation pattern 142 may be formed on each sidewall of the first and second openings 122 and 124.

A conductive layer filling the first and second openings 122 and 124 may be formed on the insulation pattern 142. The conductive layer may be planarized until the upper surfaces of the first and second structures 138 and the lower insulation layer 108 may be exposed to form the CSL 144 and the dummy source line 146. The planarization process may include a CMP process and/or an etch-back process.

In some embodiments, an upper insulation layer may be formed on the first and second structures 138 and 140 and the lower insulation layer 108. The upper insulation layer may be etched to form contact holes through which the gate lines 134 may be exposed on the wiring region. Contact plugs 150 may be formed in the contact holes. Wirings electrically connected to the contact plugs 150 may be further formed on the upper insulation layer. Thus, a memory cell structure may be formed on the cell region, and a dummy structure may be formed on the dummy region.

Memory cells defined at both ends in the third direction on the cell region may serve as the dummy cells 148 that may not participate in an actual operation. Thus, wirings and contact plugs for applying a signal may not be connected to the dummy cells 148.

Figure 14:
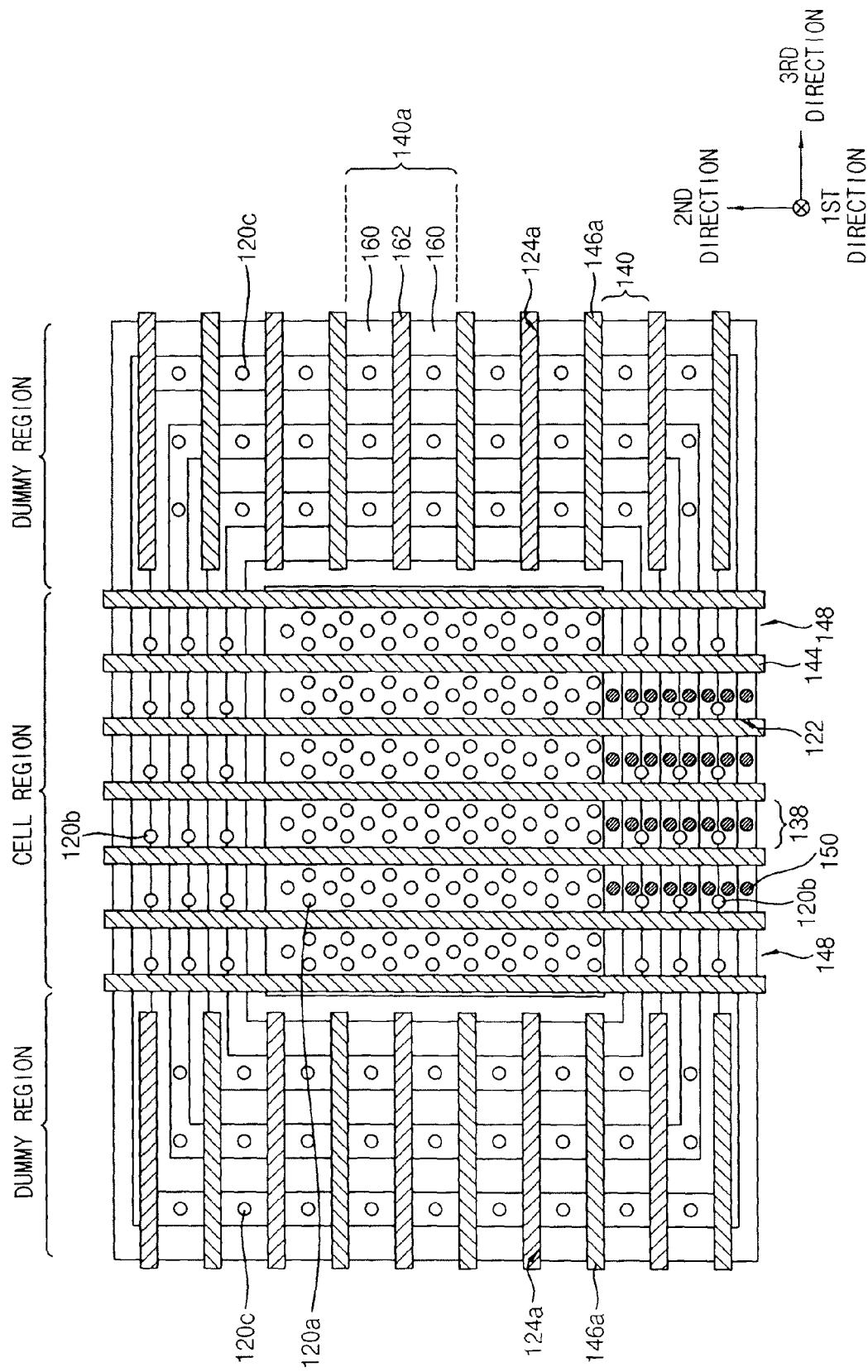
FIGS. 14 and 15 illustrate a top plan view and a perspective view, respectively, of a semiconductor device in accordance with example embodiments.
Figure 15:
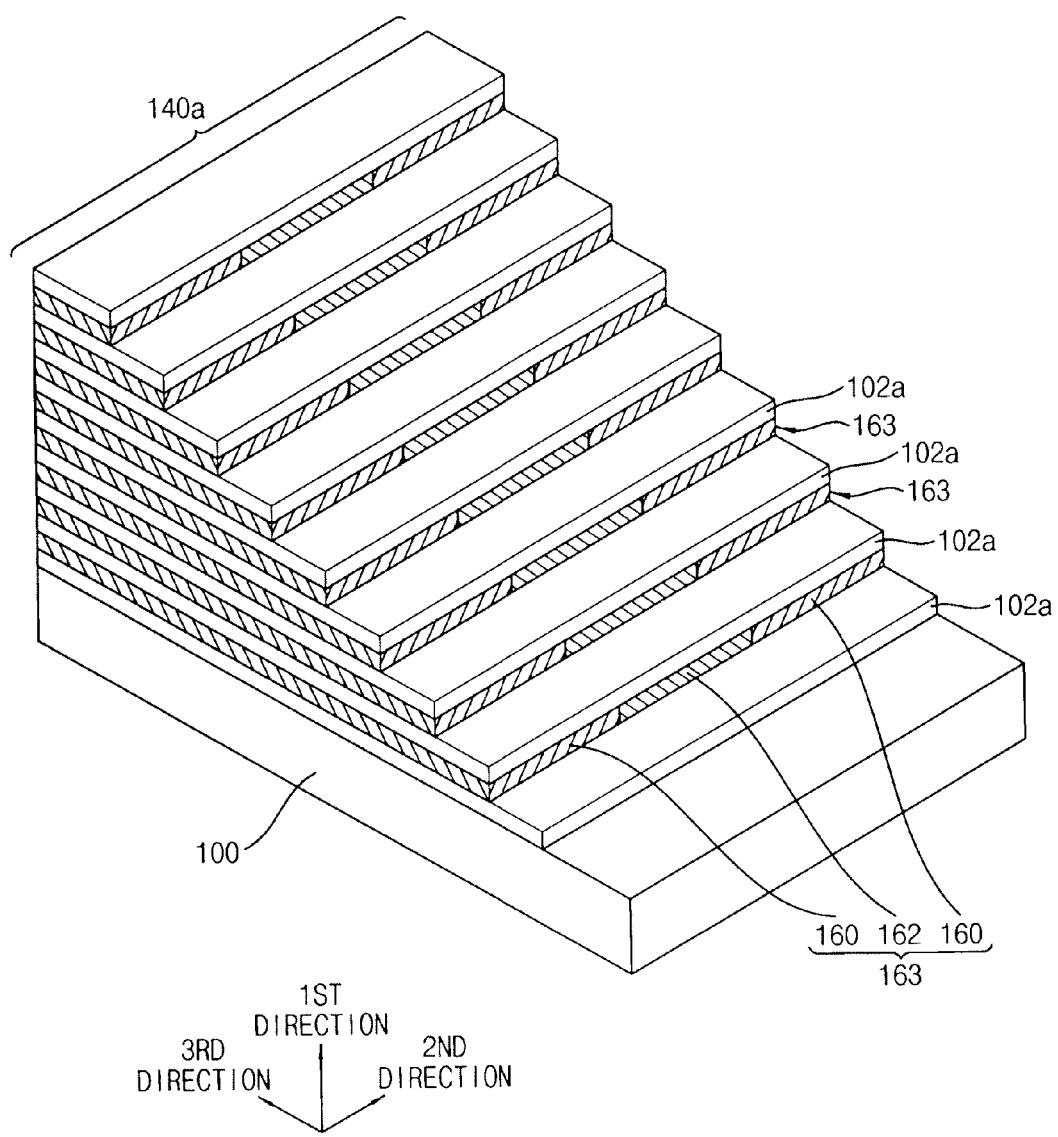

FIGS. 14 and 15 are a top plan view and a perspective view, respectively, illustrating a semiconductor device in accordance with example embodiments. FIG. 15 illustrates a second structure of the semiconductor device of FIG. 14.

The semiconductor device of FIGS. 14 and 15 may have elements and/or constructions substantially the same as or similar to those illustrated with reference to FIGS. 1 to 4 except for a dummy structure on a dummy region. Thus, detailed descriptions of repeated elements and/or structures are omitted herein, and like reference numerals are used to designate like elements.

Referring to FIGS. 14 and 15, the dummy structure on the dummy region may include second structures 140a spaced apart from each other along the second direction, and a dummy source line 146a extending between the second structures 140a. A width in the second direction of the second structure 140a may be greater than a width in the third direction of the first structure 138 on the cell region.

The second structure 140a may include the insulating interlayer patterns 102a and dummy patterns 163 which may be alternately stacked. The second structure 140a may extend in a direction different from the second direction. In example embodiments, the second structure 140a may extend in the third direction.

The insulating interlayer pattern 102a included in the second structure 140a may include substantially the same material as that of the insulating interlayer pattern 102a included in the first structure 138. The insulating interlayer patterns 102a of the first and second structures 138 and 140a may be positioned at a same height at each level.

The dummy pattern 163 of the second structure 140a may be positioned at a same height as that of a gate line 134 of the first structure 138 at each level. The dummy pattern 163 at each level may include conductive patterns 160 at both end portions in the second direction, and a second sacrificial pattern 162 interposed between the conductive patterns 160. The conductive pattern 160 may include substantially the same conductive material as that of the gate line 134. The second sacrificial pattern 162 may include a nitride-based material such as silicon nitride or silicon boronitride. The second sacrificial pattern 162 may remain from not being replaced with the conductive material.

The second structure 140a may have a stepped structure along the third direction. For example, lengths in the third direction of the insulating interlayer patterns 102a and the dummy patterns 163 may be reduced in the first direction from a top surface of the substrate 100.

A second opening 124a may be formed between the second structures 140a. The second opening 124a may extend in a direction different from the second direction. In example embodiments, the second opening 124a may extend in the third direction, and a plurality of the second openings 124a may be formed along the second direction. The second opening 124a may extend through a lower insulation layer (not illustrated) to the top surface of the substrate 100.

An insulation pattern may be formed on a sidewall of the second opening 124a. The dummy pattern 163 and a dummy source line 146a may be insulated from each other by the insulation pattern. The dummy source line 146a may be disposed in the second opening 124a, and may be in contact with the top surface of the substrate 100. The dummy source line 146a may extend in the third direction. The dummy source line 146a may include substantially the same conductive material as that of the CSL 144 of the cell region. A distance between the dummy source lines 146a neighboring in the second direction may be greater than a distance between the CSLs 144 neighboring in the third direction.

Third channel structures 120c that may have a construction substantially the same as that of the first channel structures 120a on the cell region, and may be disposed on the dummy region. The third channel structure 120c may merely serve as a pillar for supporting the second structure 140a.

In example embodiments, an amount of the nitride-based material such as silicon nitride may be reduced in the second structure 140a. Therefore, stress-related defects may be avoided in the semiconductor device.

Figure 16:
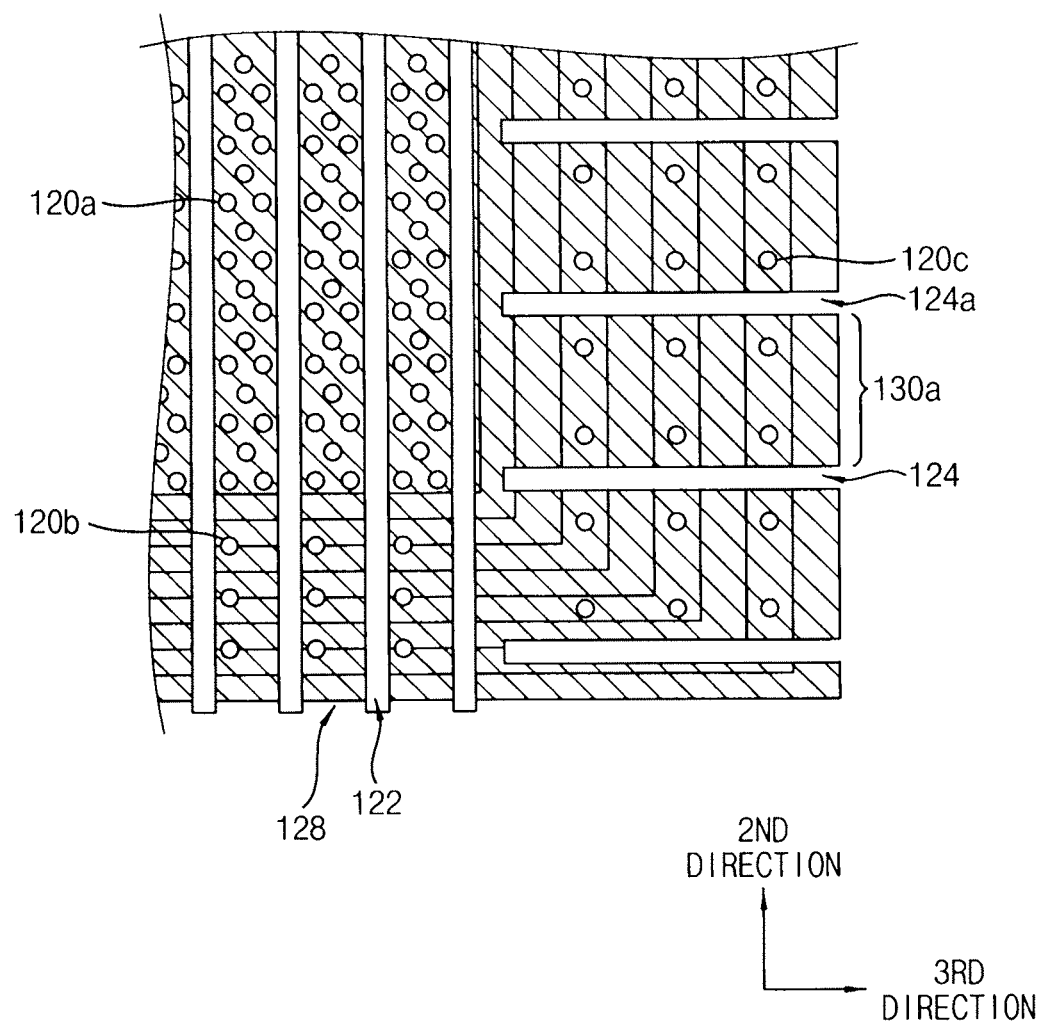
FIGS. 16 and 17 illustrate top plan views of a method of manufacturing a semiconductor device in accordance with example embodiments.
Figure 17:
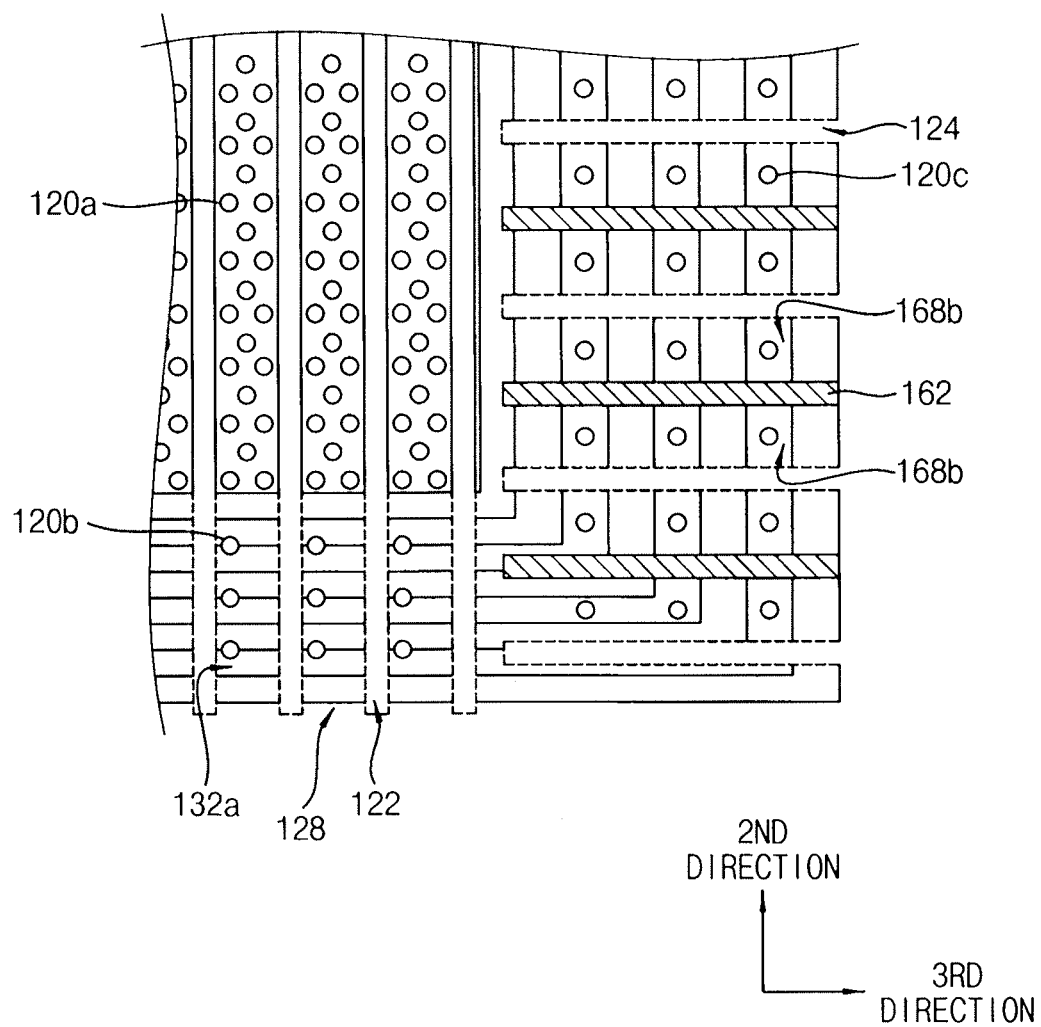

FIGS. 16 and 17 are top plan views illustrating a method of manufacturing a semiconductor device in accordance with example embodiments. For example, FIGS. 16 and 17 illustrate a method of manufacturing the semiconductor device of FIGS. 14 and 15. FIGS. 16 and 17 illustrate an end portion in the third direction of a cell region, and a dummy region.

Processes substantially the same as or similar to those illustrated with reference to FIGS. 5 and 6 may be performed to form a mold structure 106 on a substrate, and first to third channel structures 120a, 120b and 120c extending through the mold structure 106. A lower insulation layer 108 covering stepped portions of the mold structure 106 may be formed.

Referring to FIG. 16, the mold structure 106 and the lower insulation layer 108 may be partially removed by, e.g., an anisotropic etching process, to form the first openings 122 and the second openings 124a on the cell region and the dummy region, respectively. The top surface of the substrate may be exposed through the first and second openings 122 and 124a.

The first opening 122 may have a construction substantially the same as that illustrated with reference to FIG. 7. The second opening 124a may extend in a direction different from that of the first opening 122. In example embodiments, the second opening 124a may extend in the third direction. A distance between the second openings 124a neighboring in the second direction may be greater than a distance between the first openings 122 neighboring in the third direction.

The mold structure 106 may be cut or intersected by the first opening 122 along the second direction such that first mold structures 128 may be formed. The first mold structure 128 may surround a plurality of channel columns, and may extend in the second direction.

The mold structure 106 may be cut or intersected by the second openings 124a along the third direction such that second mold structures 130a may be formed. A width in the second direction of the second mold structure 130a may be greater than a width in the third direction of the first mold structure 128.

The first and second mold structures 128 and 130a may include insulating interlayer patterns and sacrificial patterns that may be alternately stacked. Impurities may be implanted through the first and second openings 122 and 124a to form impurity regions at upper portions of the substrate.

Referring to FIG. 17, the sacrificial patterns exposed by the first and second openings 122 and 124a may be removed by, e.g., an isotropic etching process. The sacrificial patterns formed on the cell region may be fully removed. Thus, first gaps 132a may be formed at spaces from which the sacrificial patterns on the cell region are removed. A sidewall of the first channel structure 120a may be partially exposed by the first gap 132a.

The sacrificial pattern on the dummy region may have a width greater than that of the sacrificial pattern on the cell region. Thus, the sacrificial pattern on the dummy region may be only partially removed while the sacrificial pattern on the cell region may be fully removed. Accordingly, second gaps 168b may be formed at spaces from which the sacrificial patterns on the dummy region are removed, and a second sacrificial pattern 162 having a reduced width may remain at each level. A sidewall of the second sacrificial pattern 162 may be exposed by the second gap 168b.

Referring to FIGS. 14 and 15 again, the gate line 134 may be formed in each first gap 132a, and the conductive pattern 160 may be formed in each second gap 168b. The gate line 134 and the conductive pattern 160 may be formed by processes substantially the same as or similar to those illustrated with reference to FIGS. 11 and 12.

After performing the aforementioned processes, the first structure 138 extending in the second direction and including the insulating interlayer patterns and gate lines 134 may be formed on the cell region. The second structure 140a extending in the third direction and including the insulating interlayer patterns 102a and dummy patterns 163 may be formed on the dummy region.

As described above, a portion of the sacrificial pattern included in the second mold structure 130a may be replaced with the conductive pattern to form the second structure 140a. Thus, stress imposed on the first structure 138 may be reduced to suppress structural defects of the first structure 138. Subsequently, insulation patterns may be formed on sidewalls of the first and second openings 122 and 124a, and then the CSL 144 and the dummy source line 146a may be formed in the first opening 122 and the second opening 124a, respectively, as illustrated with reference to FIG. 13 to obtain the semiconductor device of FIG. 14.

Figure 18:
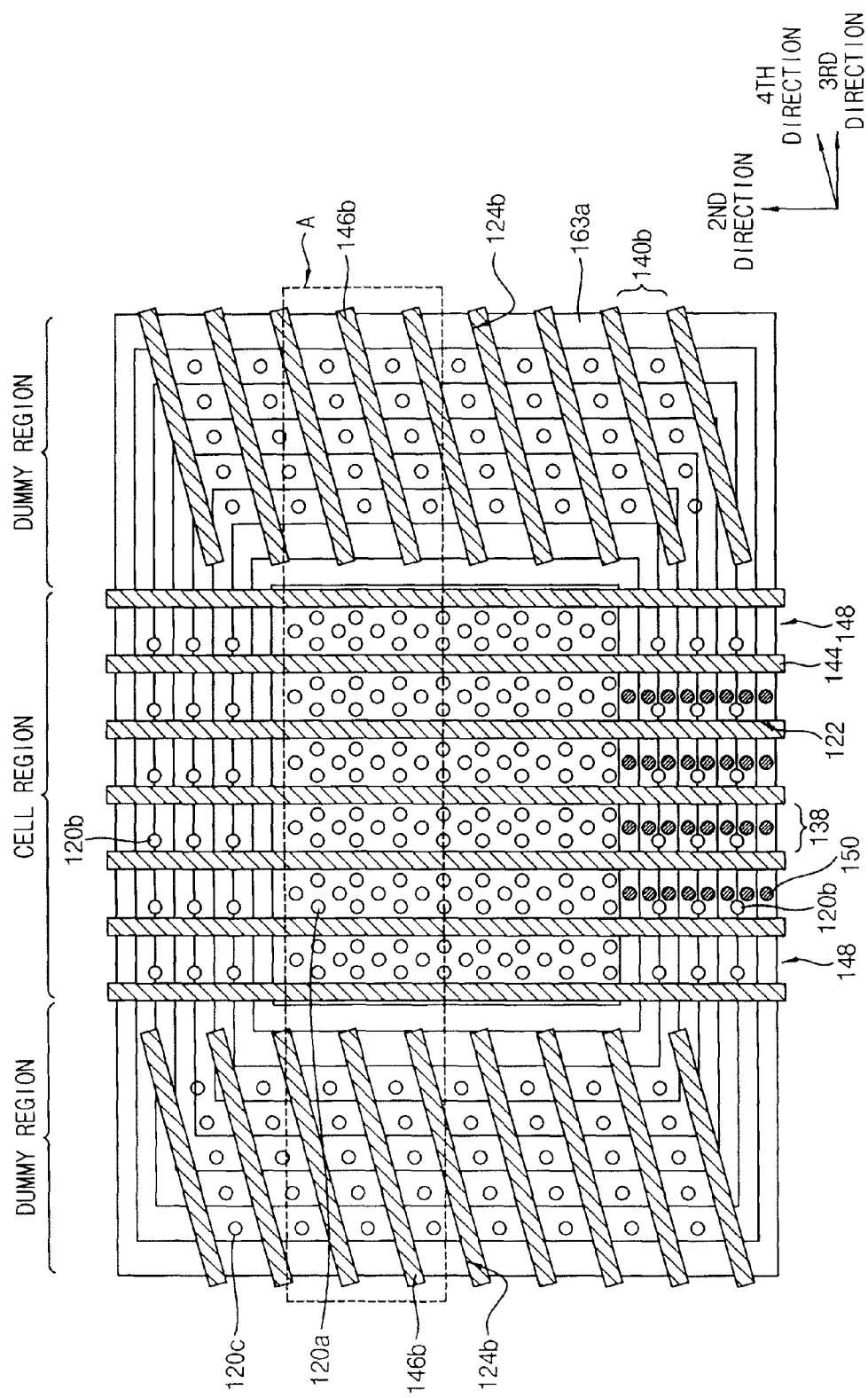
FIGS. 18 and 19 illustrate a top plan view and a perspective view, respectively, of a semiconductor device in accordance with example embodiments.
Figure 19:
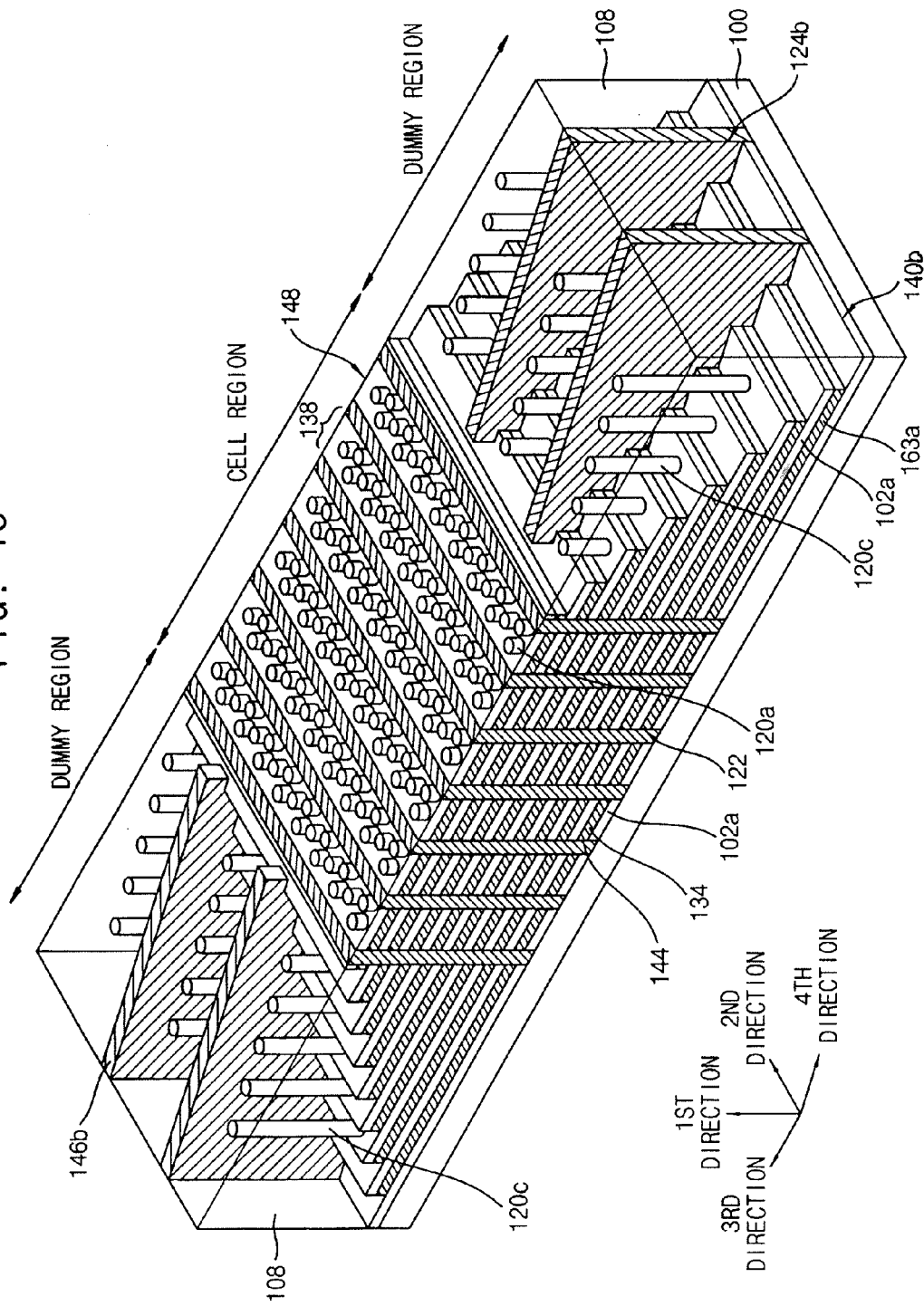

FIGS. 18 and 19 are a top plan view and a perspective view, respectively, illustrating a semiconductor device in accordance with example embodiments. FIG. 19 is an enlarged perspective view of a portion "A" in FIG. 18.

The semiconductor device of FIGS. 18 and 19 may have elements and/or constructions substantially the same as or similar to those illustrated with reference to FIGS. 1 to 4, except for a dummy structure on a dummy region. Thus, detailed descriptions of repeated elements and/or structures are omitted herein, and like reference numerals are used to designate like elements.

Referring to FIGS. 18 and 19, the dummy structure on the dummy region may include second structures 140b spaced apart from each other on the substrate 100 along the second direction, and a dummy source line 146b extending between the second structures 140b. The second structure 140b may include insulating interlayer patterns 102a and dummy patterns 163a that may be alternately stacked.

The dummy pattern 163a may include substantially the same material as that of the gate line 134 on the cell region. In some embodiments, the dummy pattern 163a may include a conductive pattern (not illustrated) formed of the same conductive material as that of the gate line 134, and a second sacrificial pattern (not illustrated) including silicon nitride.

In example embodiments, a width in the second direction of the second structure 140b may be substantially the same as a width in the third direction of the first structure 138. In some embodiments, the width in the second direction of the second structure 140*b* may be greater than the width in the third direction of the first structure 138.

The second structure 140*b* may extend in a direction different from the second direction. In example embodiments, the second structure 140*b* may extend in a fourth direction diagonal to the second and third directions. Thus, a second opening 124*b* between the second structures 140*b* may extend in the fourth direction.

An insulation pattern may be formed on a sidewall of the second opening 124*b*. The dummy source line 146*b* may be formed in the second opening 124*b*. The dummy source line 146*b* may extend in the fourth direction. The semiconductor device of FIGS. 18 and 19 may be manufactured by a method substantially the same as or similar to that illustrated with reference to FIGS. 5 to 13, except that the second opening 124*b* may be formed to extend in the fourth direction.

Figure 20:
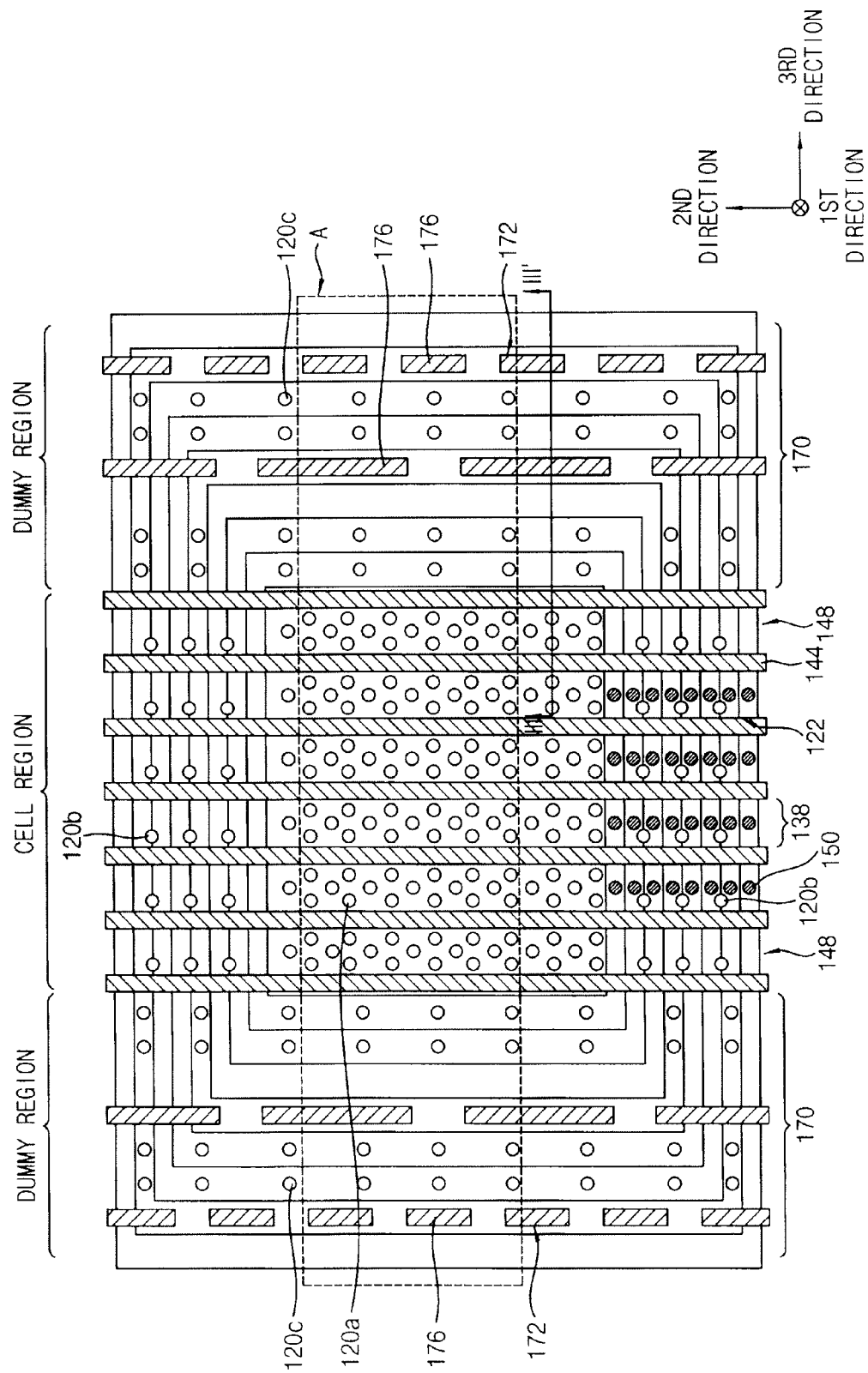
FIGS. 20, 21 and 22 illustrate a top plan view, a perspective view, and a cross-sectional view, respectively, illustrating a semiconductor device in accordance with example embodiments.
Figure 21:
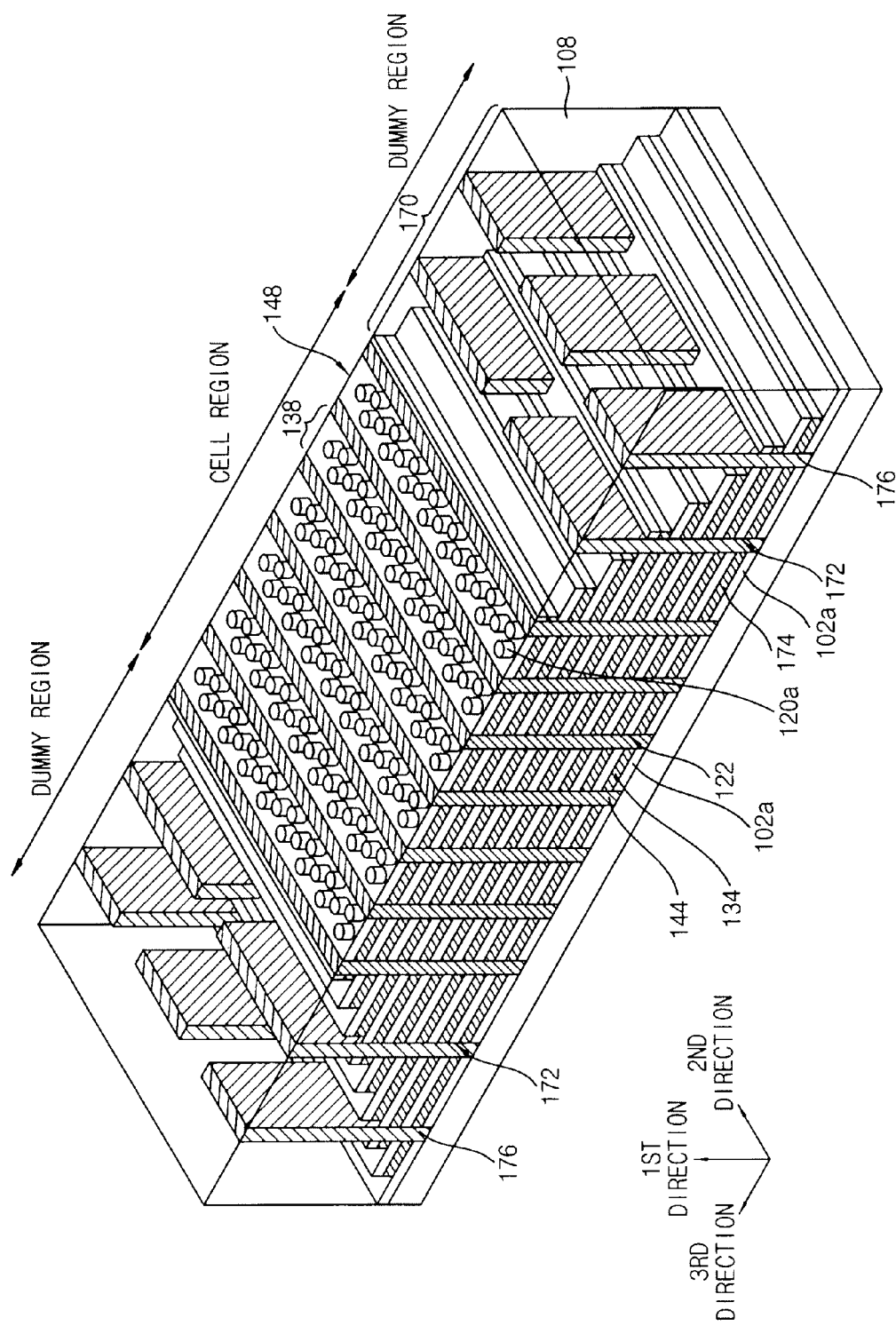
Figure 22:
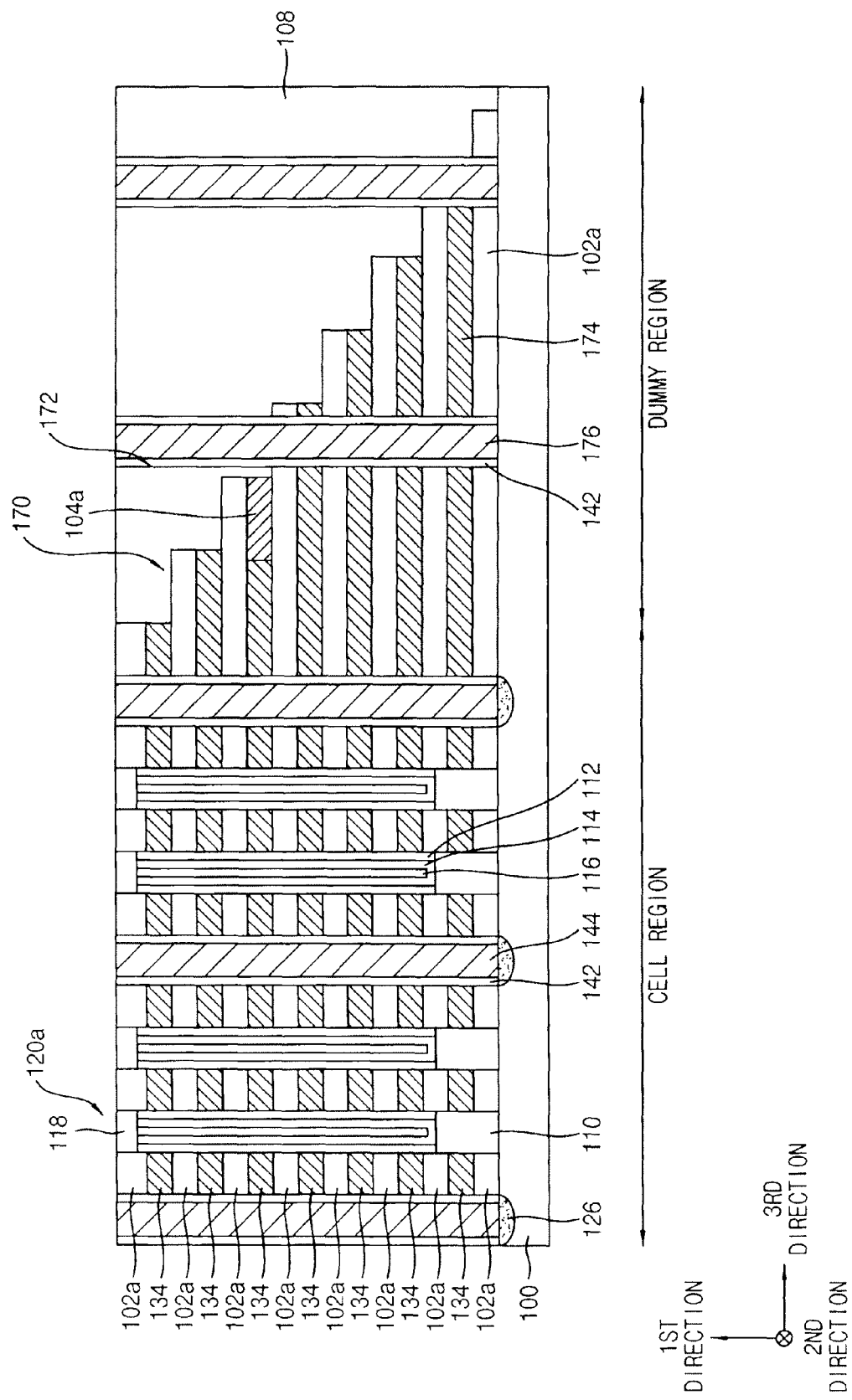

FIGS. 20, 21 and 22 are a top plan view, a perspective view, and a cross-sectional view, respectively, illustrating a semiconductor device in accordance with example embodiments. FIG. 21 is an enlarged perspective view of a portion "A" in FIG. 20. FIG. 22 is a cross-sectional view taken along line of FIG. 20. For convenience of descriptions, an illustration of a third channel structure is omitted in FIG. 21.

The semiconductor device of FIGS. 20 to 22 may have elements and/or constructions substantially the same as or similar to those illustrated with reference to FIGS. 1 to 4, except for a dummy structure on a dummy region. Thus, detailed descriptions of repeated elements and/or structures are omitted herein, and like reference numerals are used to designate like elements.

Referring to FIGS. 20 to 22, the dummy structure on the dummy region may include a second structure 170 having a stepped structure along the third direction, and a second opening 172 extending through the second structure 170 and in the second direction, and a dummy source line 176 formed in the second opening 172.

The second structure 170 may include the insulating interlayer patterns 102*a* and dummy patterns 174 that may be alternately stacked. An end portion in the third direction of the second structure 170 may have a stepped shape. The second structure 170 may be cut or intersected along the second direction by the second opening 172.

The second opening 172 may have a trench shape extending in the second direction, and a plurality of the second openings 172 may be arranged along the second and the third directions. In example embodiments, the second openings 172 may have different lengths in the second direction. In example embodiments, a distance between the second openings 172 neighboring in the second direction may not be uniform. In some embodiments, the second openings 172 may have the same length in the second direction, and a distance between the second openings 172 neighboring in the second direction may be uniform.

The dummy source line 176 may be disposed in the second opening 172. An insulation pattern 142 may be formed on a sidewall of the second opening 172. The dummy source line 176 may extend in the same direction as that of the CSL 144 on the cell region.

The dummy source line 176 may extend in the second direction, and the plurality of the dummy source lines 176 may be spaced apart from each other in the second direction. The dummy source lines 176 may be further arranged along the third direction. A length in the second direction of the dummy source line 176 may be less than that of the CSL 144. In example embodiments, a distance between the dummy source lines 176 neighboring in the third direction may be equal to or greater than a distance between the CSLs 144 neighboring in the third direction.

The dummy pattern 174 may include the same material as that of a gate line 134 of the cell region. In some embodiments, the dummy pattern 174 may include a conductive pattern formed of the same material as that of the gate line 134, and a second sacrificial pattern 104*a* formed of silicon nitride.

In example embodiments, memory cells defined at both ends in the third direction on a cell region may serve as dummy cells 148 that may not participate in an actual operation. Thus, wirings and contact plugs for applying a signal may not be connected to the dummy cells 148.

In some embodiments, the CSL included in the dummy cell 148 may have a shape substantially the same as those of the CSL 144 on a main cell region and/or the dummy source line 176.

Figure 23:
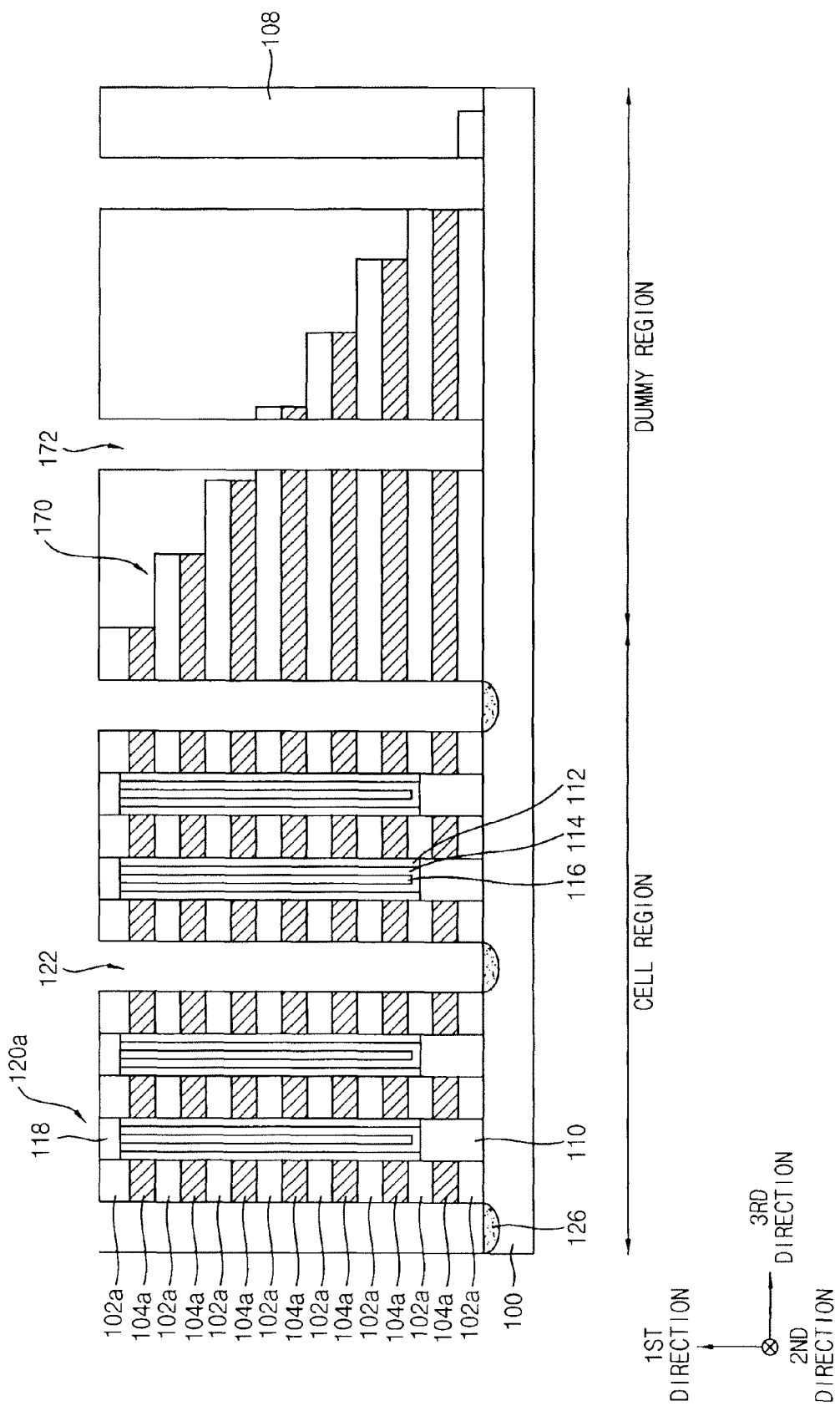
FIGS. 23 and 24 illustrate cross-sectional views of a method of manufacturing a semiconductor device in accordance with example embodiments.
Figure 24:
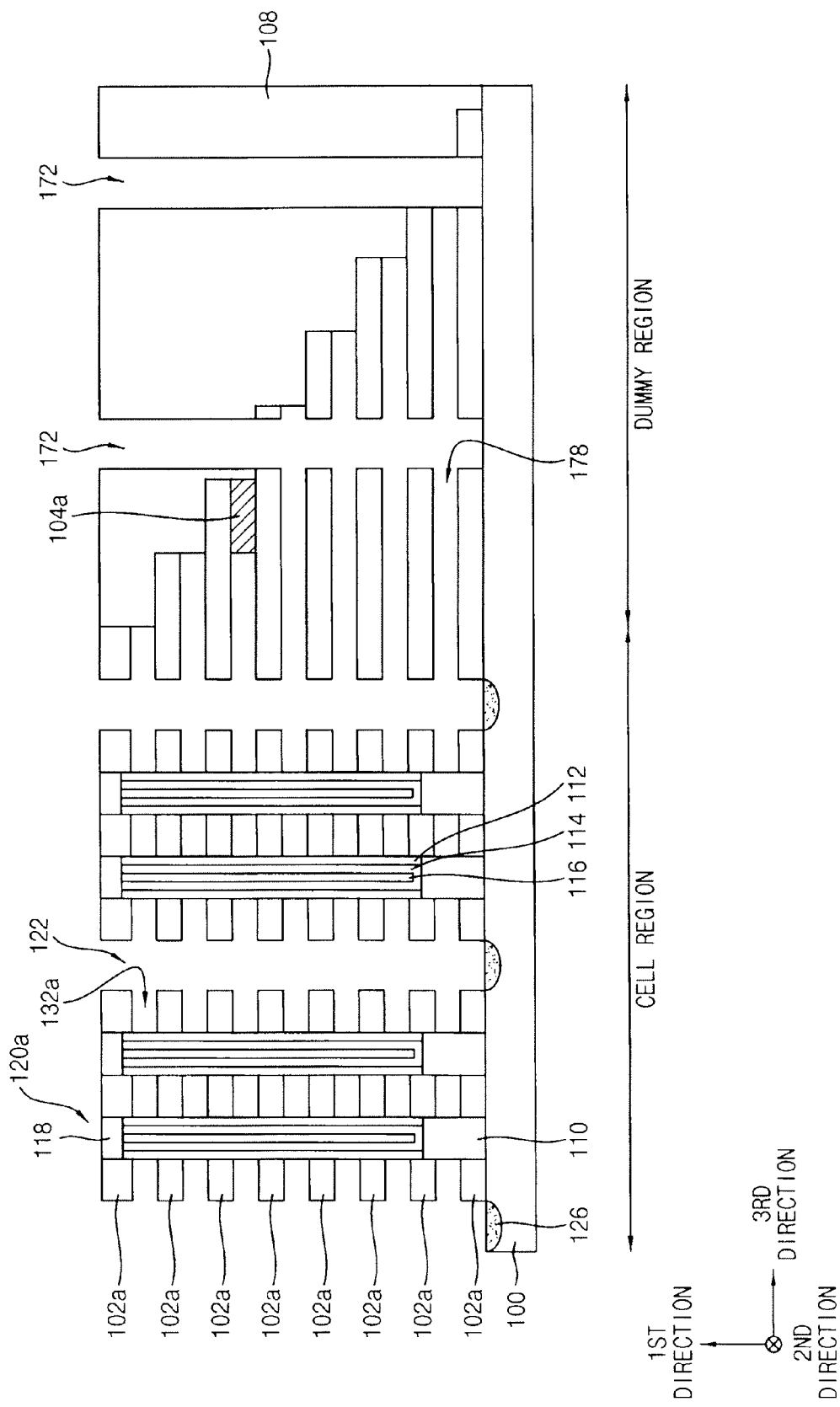

FIGS. 23 and 24 are cross-sectional views illustrating a method of manufacturing a semiconductor device in accordance with example embodiments. For example, FIGS. 23 and 24 illustrate a method of manufacturing the semiconductor device of FIGS. 20 to 22.

Referring to FIG. 23, processes substantially the same as or similar to those illustrated with reference to FIGS. 5 and 6 may be performed to form a mold structure 106 on the substrate 100, and first to third channel structures 120*a*, 120*b*, and 120*c* extending through the mold structure 106. The lower insulation layer 108 covering stepped portions of the mold structure 106 may be formed.

The mold structure 106 and the lower insulation layer 108 may be partially removed by, e.g., an anisotropic etching process, to form the first openings 122 and the second openings 172 on the cell region and the dummy region, respectively. The top surface of the substrate 100 may be exposed through the first and second openings 122 and 172.

The first opening 122 may have a shape or a structure substantially the same as that illustrated with reference to FIG. 7. The second opening 172 may have a trench shape extending in the second direction, and a plurality of the second openings 172 may be spaced apart from each other along the second direction. The second openings 172 may be also formed along the third directions. In example embodiments, the first and second openings 122 and 172 may extend in the same direction.

In example embodiments, a distance between the second openings 172 neighboring in the third direction may be substantially the same as a distance between the first openings 122 neighboring in the third direction. In some embodiments, the distance between the second openings 172 neighboring in the third direction may be greater than the distance between the first openings 122 neighboring in the third direction.

Referring to FIG. 24, processes substantially the same as or similar to those illustrated with reference to FIGS. 9 and 10 may be performed to remove the sacrificial patterns 104*a* from the mold structure 106.

The sacrificial patterns 104*a* formed on the cell region may be fully removed. While removing the sacrificial patterns 104*a* on the cell region, the sacrificial patterns formed on the dummy region may be fully or partially removed. In example embodiments, a portion of the sacrificial pattern 104*a* may remain at an area in which the sacrificial pattern 104*a* may not be exposed by the second opening 172.

First gaps 132*a* may be formed at spaces from which the sacrificial patterns 104*a* on the cell region are removed, and second gaps 178 may be formed at spaces from which the sacrificial patterns 104a on the dummy region are removed. A sidewall of the first channel structure 120a may be partially exposed by the first gap 132a.

Referring to FIGS. 20 to 22 again, the gate line 134 may be formed in the first gap 132a at each level, and the dummy pattern 174 may be formed in the second gap 178 at each level. The gate line 134 and the dummy pattern 174 may be formed by processes substantially the same as or similar to those illustrated with reference to FIGS. 11 and 12.

Subsequently, the insulation patterns 142 may be formed on sidewalls of the first and second openings 122 and 172, and the CSL 144 and a dummy source line 176 filling the first opening 122 and the second opening 172, respectively, may be formed as illustrated with reference to FIG. 13. Thus, the semiconductor device of FIGS. 20 to 22 may be achieved.

Figure 25:
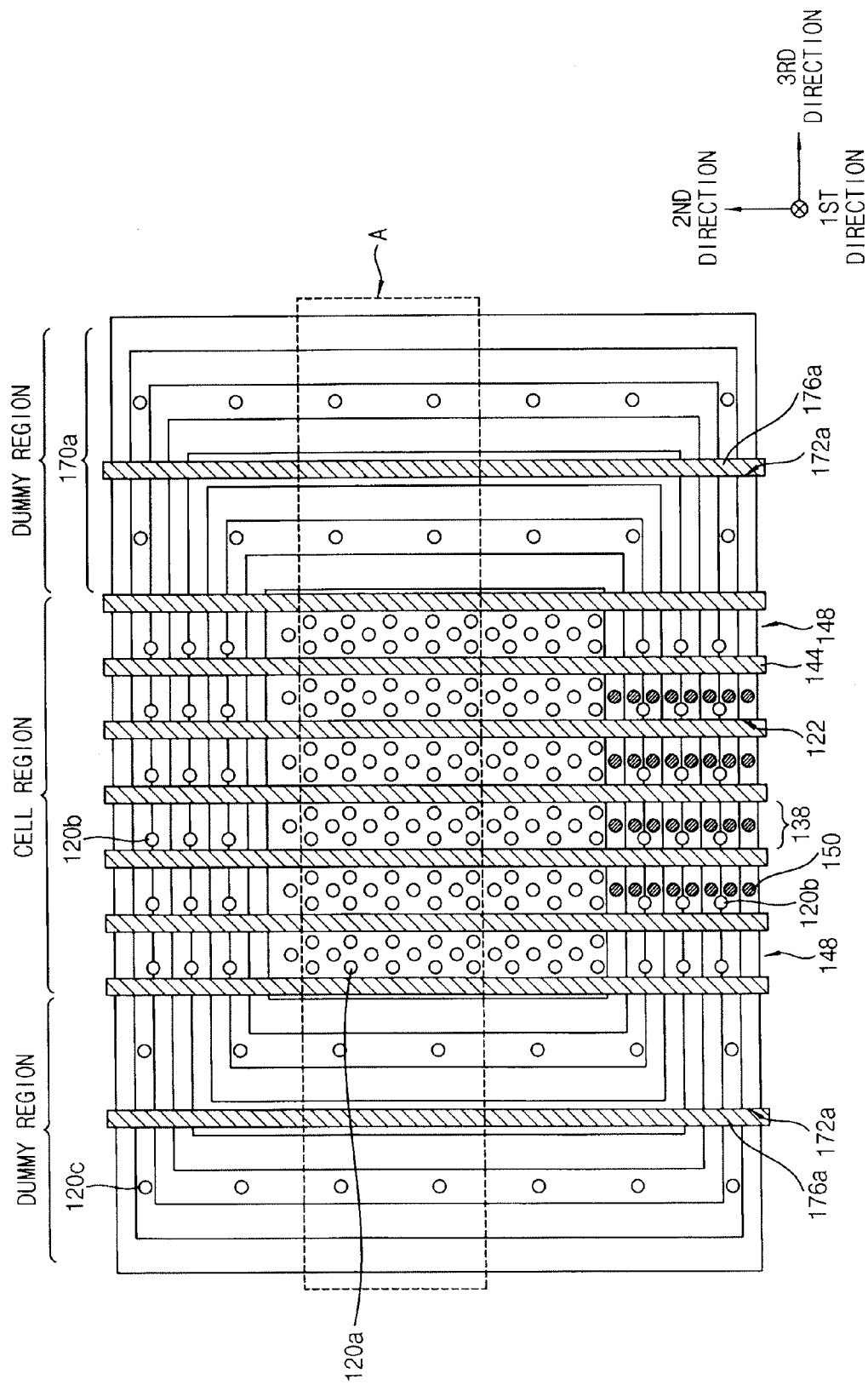
FIGS. 25, 26 and 27 illustrate a top plan view, a perspective view, and a cross-sectional view, respectively, of a semiconductor device in accordance with example embodiments.
Figure 26:
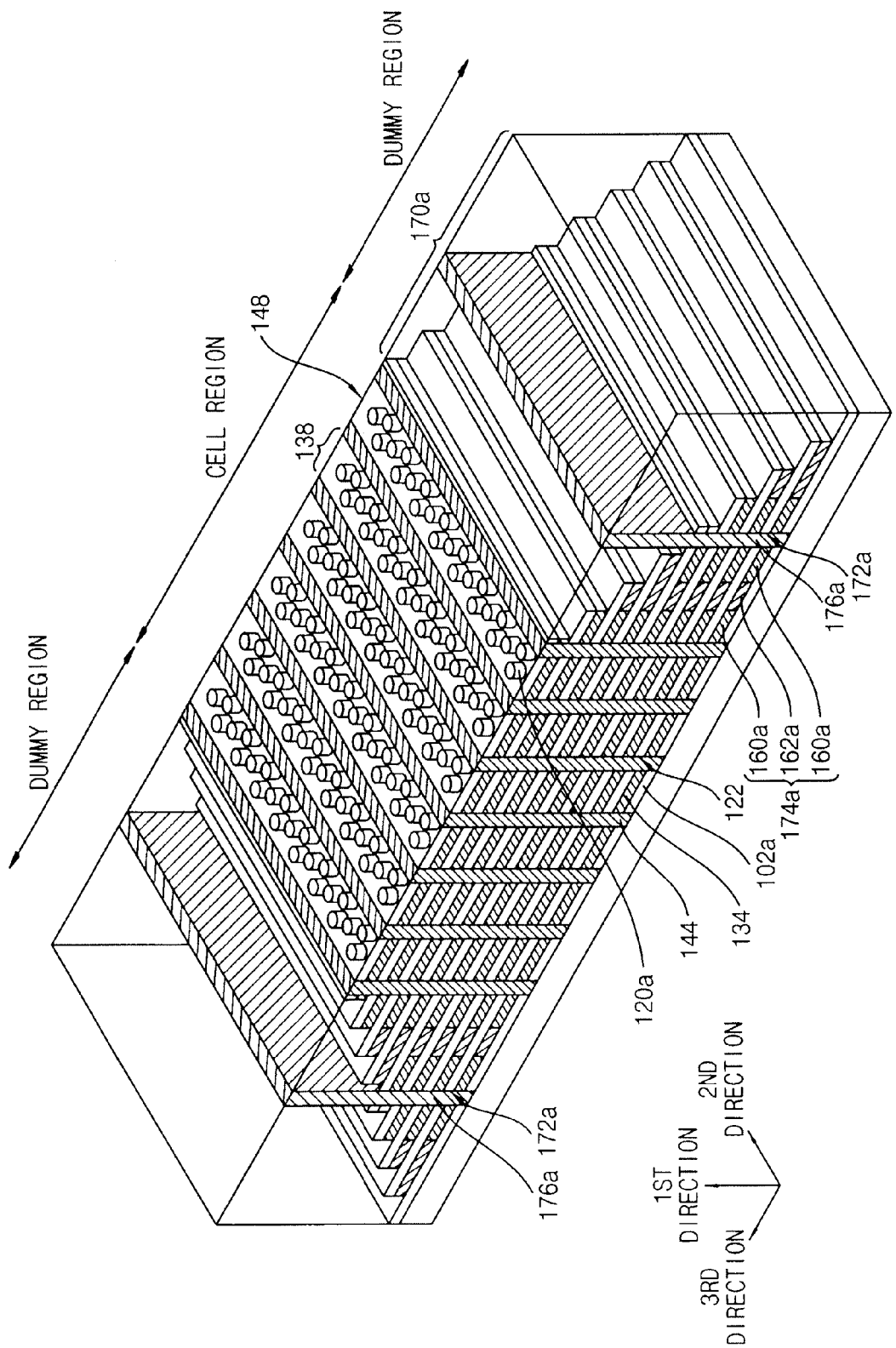
Figure 27:
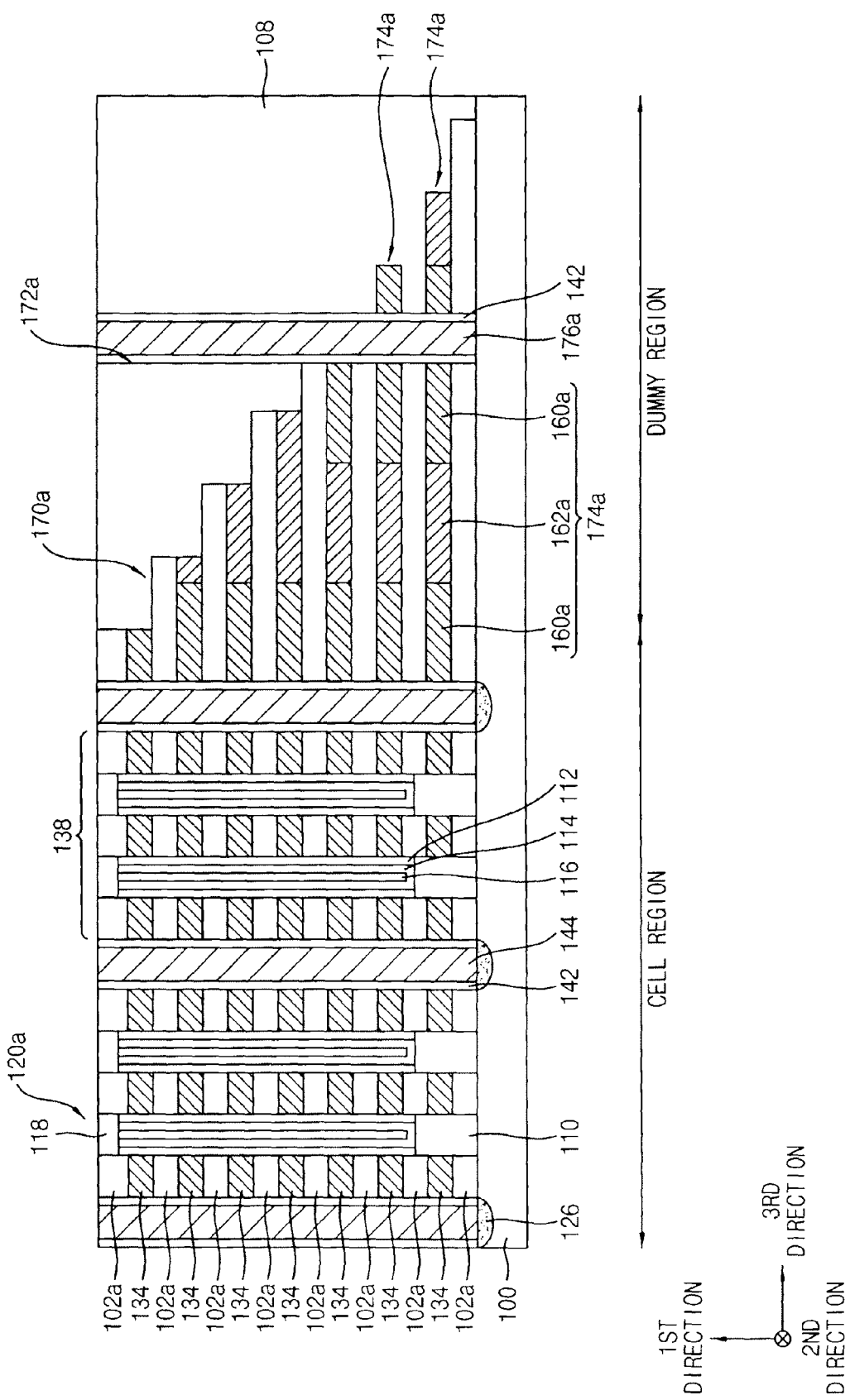

FIGS. 25, 26, and 27 are a top plan view, a perspective view, and a cross-sectional view, respectively, illustrating a semiconductor device in accordance with example embodiments. The semiconductor device of FIGS. 25 to 27 may have elements and/or constructions substantially the same as or similar to those illustrated with reference to FIGS. 1 to 4, except for a dummy structure on a dummy region. Thus, detailed descriptions of repeated elements and/or structures are omitted herein, and like reference numerals are used to designate like elements.

Referring to FIGS. 25 to 27, the dummy structure on the dummy region may include a second structure 170a having a stepped structure along the third direction, a second opening 172a extending through the second structure 170a and in the second direction, and a dummy source line 176a formed in the second opening 172a. The second structure 170a may include insulating interlayer patterns 102a and dummy patterns 174a that may be alternately stacked.

The second opening 172a may extend in the second direction. In some embodiments, a plurality of the second openings 172a may be formed along the third direction. In example embodiments, the first opening 122 and the second opening 172a may have substantially the same shape.

The dummy source line 176a may be formed in the second opening 172a. The insulation pattern 142 may be formed on a sidewall of the second opening 172a.

The dummy source line 176a may extend in a direction substantially the same as that of the CSL 144 on the cell region. For example, the dummy source line 176a and the CSL may extend in the second direction. The second structure 170a may be cut or intersected by the dummy source line 176a. In example embodiments, a width in the third direction of the dummy source line 176a may be equal to or greater than that of the CSL 144.

In example embodiments, a distance between the dummy source lines 176a may be greater than a distance between the CSLs 144 neighboring in the third direction. FIG. 25 only illustrates one dummy source line 176a on each dummy region, however, at least two dummy source lines 176a may be formed on the each dummy region.

The dummy pattern 174a may include the same material as that of a gate line 134. In example embodiments, the dummy pattern 174a at a certain level may include a conductive pattern 160a formed of the same material as that of the gate line 134, and a second sacrificial pattern 162a formed of a nitride. The dummy pattern 174a at a certain level may only include the conductive pattern 160a.

In example embodiments, memory cells defined at both ends in the third direction on the cell region may serve as dummy cells 148 that may not participate in an actual operation. Thus, wirings and contact plugs for applying a signal may not be connected to the dummy cells 148.

In example embodiments, the CSL included in the dummy cell 148 may have a shape substantially the same as that of the CSL 144 on a main cell region. In some embodiments, the CSL included in the dummy cell 148 may have a shape substantially the same as that of the dummy source line 176a.

The semiconductor device of FIGS. 25 to 27 may be manufactured from a method substantially the same as or similar to that illustrated with reference to FIGS. 23 and 24. However, when forming the first and second openings, the second openings may be formed to cut the second structure along the second direction and have a greater distance therebetween than a distance between the first openings.

Figure 28:
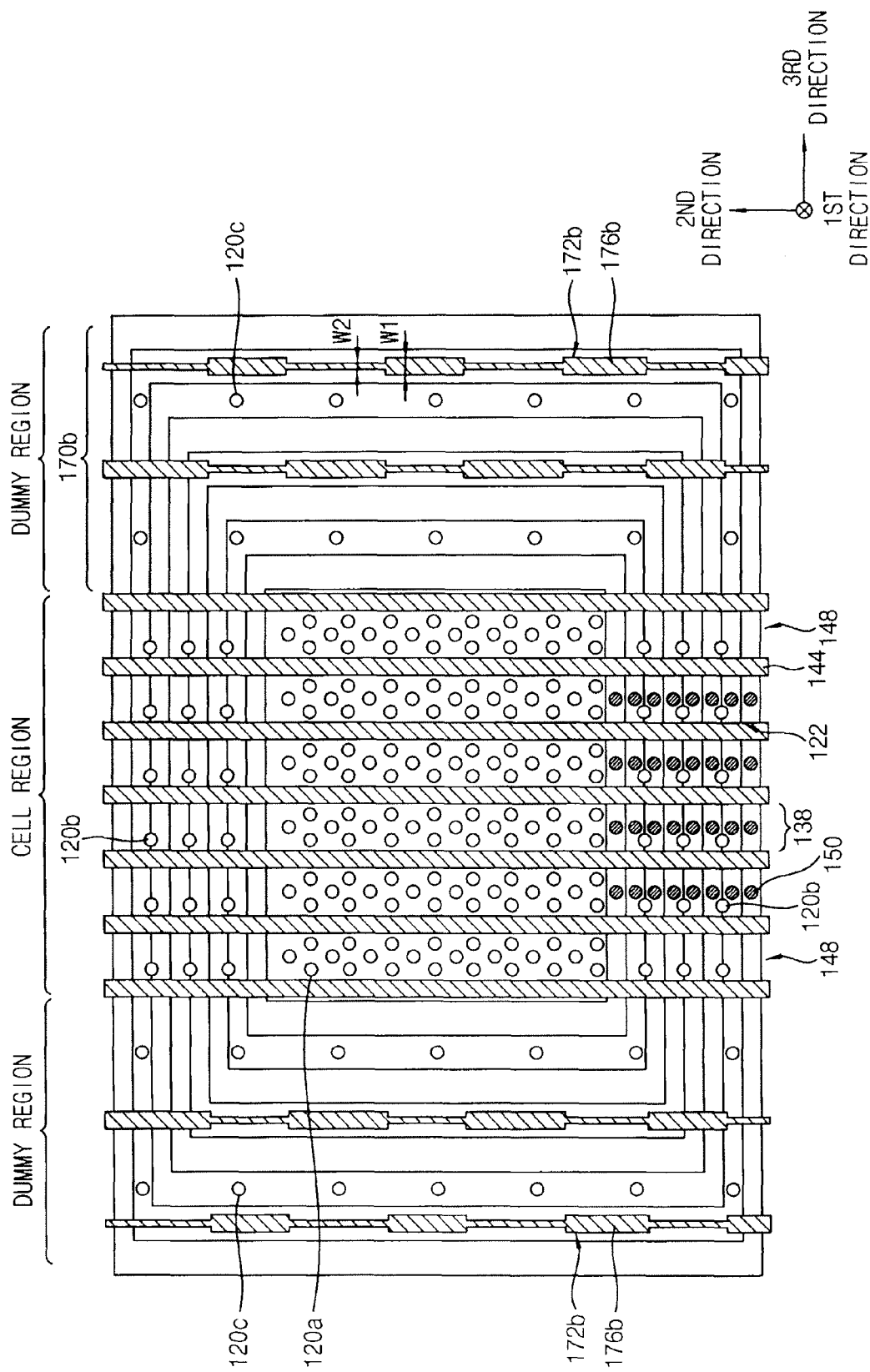
FIG. 28 illustrates a top plan view of a semiconductor device in accordance with example embodiments.

FIG. 28 is a top plan view illustrating a semiconductor device in accordance with example embodiments.

The semiconductor device of FIG. 28 may have elements and/or constructions substantially the same as or similar to those illustrated with reference to FIGS. 1 to 4 except for a dummy structure on a dummy region. Thus, detailed descriptions on repeated elements and/or structures are omitted herein, and like reference numerals are used to designate like elements Referring to FIG. 28, the dummy structure on the dummy region may include a second structure 170b having a stepped structure along the third direction, a second opening 172b extending through the second structure 170b and in the second direction, and a dummy source line 176b formed in the second opening 172b.

The second structure 170b may include insulating interlayer patterns and dummy patterns that may be alternately stacked.

The second opening 172b may extend in the second direction, and a plurality of the second openings 172b may be formed along the third direction. The second opening 172b may have different widths therein. The second structure 172b may be cut or intersected by the second opening 172b.

The dummy source line 176b may be disposed in the second opening 172b. An insulation pattern may be formed on a sidewall of the second opening 172b.

The dummy source line 176b may extend in the same direction as that of the CSL 144 on a cell region. The dummy source line 176b may have different widths according to a shape of the second opening 172b.

In example embodiments, the dummy source line 176b may have a shape in which a portion of a first width W1 and a portion of a second width W2 smaller than the first width W1 may be repeated.

The dummy pattern may include the same material as that of a gate line on the cell region. In some embodiments, the dummy pattern at a certain level may include a conductive pattern formed of the same material as that of the gate line, and a second sacrificial pattern formed of a nitride. The dummy pattern at a certain level may only include the conductive pattern.

The semiconductor device of FIG. 28 may be manufactured by a method substantially the same as or similar to that illustrated with reference to FIGS. 23 and 24 except that the second opening 172b may be formed to have different widths.

Figure 29:
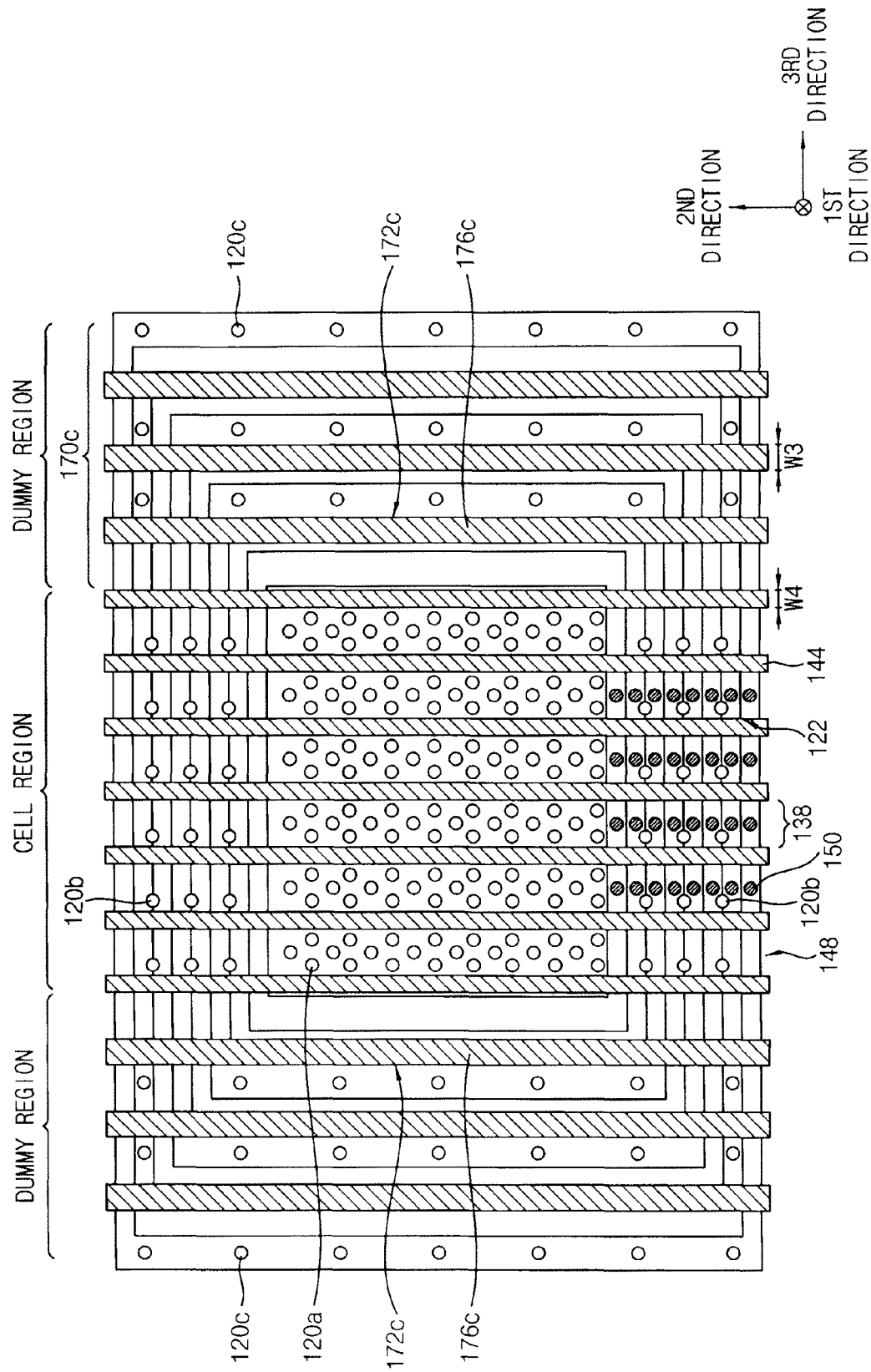
FIG. 29 illustrates a top plan view of a semiconductor device in accordance with example embodiments.

FIG. 29 is a top plan view illustrating a semiconductor device in accordance with example embodiments.

The semiconductor device of FIG. 29 may have elements and/or constructions substantially the same as or similar to those illustrated with reference to FIGS. 1 to 4 except for a dummy structure on a dummy region. Thus, detailed descriptions on repeated elements and/or structures are omitted herein, and like reference numerals are used to designate like elements.

Referring to FIG. 29, the dummy structure on the dummy region may include a second structure 170c having a stepped structure along the third direction, a second opening 172c extending through the second structure 170c and in the second direction, and a dummy source line 176c formed in the second opening 172c.

The second structure 170c may include insulating interlayer patterns and dummy patterns that may be alternately stacked.

The second opening 172c may extend in the second direction, and a plurality of the second openings 172c may be formed along the third direction. The second opening 172c may have a width equal to or greater than that of a first opening 122.

The dummy source line 176c may be disposed in the second opening 172c. An insulation pattern may be formed on a sidewall of the second opening 172c.

The dummy source line 176c may have a width in the third direction equal to or greater than that of the CSL 144 on a cell region. At least a portion of the dummy source lines 176c may have a width different from that of the CSL 144.

In example embodiments, at least one dummy source line 176c may have a width W3 greater than a width W4 of the CSL 144, and remaining dummy source lines 176c may have a width substantially the same as the width W4 of the CSL 144. In some embodiments, the dummy source lines 176c may have a width greater than the width W4 of the CSL 144.

The dummy pattern may include the same material as that of a gate line on the cell region. In some embodiments, the dummy pattern at a certain level may include a conductive pattern formed of the same material as that of the gate line, and a second sacrificial pattern formed of a nitride. The dummy pattern at a certain level may only include the conductive pattern.

The semiconductor device of FIG. 29 may be manufactured by a method substantially the same as or similar to that illustrated with reference to FIGS. 23 and 24 except that at least a portion of the second openings 172c may be formed to have a different width from a width of the first opening 122.

Figure 30:
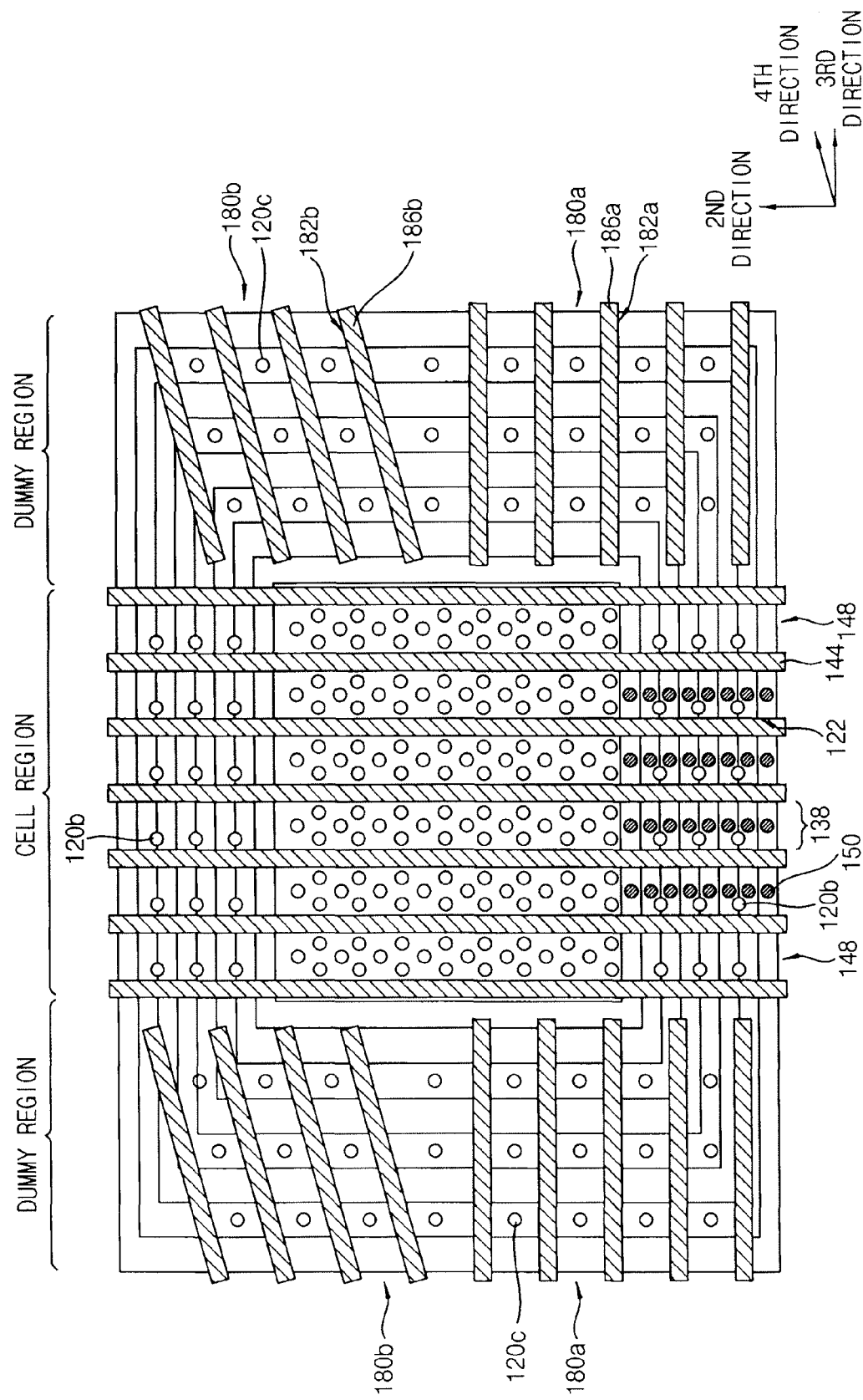
FIG. 30 illustrates a top plan view of a semiconductor device in accordance with example embodiments.

FIG. 30 is a top plan view illustrating a semiconductor device in accordance with example embodiments.

The semiconductor device of FIG. 30 may have elements and/or constructions substantially the same as or similar to those illustrated with reference to FIGS. 1 to 4 except for a dummy structure on a dummy region. Thus, detailed descriptions on repeated elements and/or structures are omitted herein, and like reference numerals are used to designate like elements Referring to FIG. 30, the dummy structure on the dummy region may include second structures 180a and 180b having stepped structures along the third direction, second and third openings 182a and 182b extending through the second structures 180a and 180b and first and second dummy source lines 186a and 186b formed in the second opening 182a and the third opening 182b, respectively.

The second structures 180a and 180b may include insulating interlayer patterns and dummy patterns that may be alternately stacked.

The second opening 182a and the third opening 182b may have different orientations or different shapes.

In example embodiments, the second opening 182a may extend in the third direction. The third opening 182b may extend in a fourth direction diagonal to the second and third directions. Thus, the second structure 180a defined by the second openings 182a and the second structure 180b defined by the third openings 182b may also have different orientations or different shapes.

However, the shapes of the second and third openings 182a and 182b may not be specifically limited, and may be modified in consideration of a reduction of stress. In some embodiments, the second and third openings 182a and 182b may have any shape selected from those of the second openings illustrated in the above-described embodiments. The shapes of the second structures 180a and 180b may be also modified by constructions of the second and third openings 182a and 182b.

The dummy patterns may include substantially the same material as that of a gate line on a cell region.

The semiconductor device of FIG. 30 may be manufacture by a method substantially the same as or similar to those illustrated with reference to FIGS. 23 and 24 except that the second and third openings having various shapes may be formed on the dummy region.

FIG. 31 is a top plan view illustrating a semiconductor device in accordance with example embodiments.

Referring to FIG. 31, the semiconductor device may include a memory cell structure on a cell region of a substrate 100, and a dummy structure on a dummy region of the substrate 100. A peripheral circuit region (abbreviated as Peri Region in FIG. 31) may be located at an outside of the cell region and the dummy region.

A construction on the cell region and the dummy region may be selected from the embodiments as described above, e.g., as illustrated with reference to FIGS. 1 to 4.

Peripheral circuits may be disposed on the peripheral circuit region of the substrate 100. An insulating interlayer covering the peripheral circuits may be formed on the substrate 100. The insulating interlayer may be a portion of the lower insulation layer 108 illustrated in FIGS. 2 and 4.

A dummy conductive pattern 190 may be formed through the insulating interlayer. The dummy conductive pattern 190 may extend to a top surface of the substrate 100. The dummy conductive pattern 190 may be formed together with the CSL 144 and a dummy source line 146. Thus, the dummy conductive pattern 190, the CSL 144 and the dummy source line 146 may include the same conductive material.

In example embodiments, the dummy conductive pattern 190 may extend in the third direction. In some embodiments, the dummy conductive pattern 190 may extend in the second direction or the fourth direction.

In example embodiments, widths of the dummy conductive patterns 190 may be the same or different.

The dummy conductive patterns 190 may have various shapes. In example embodiments, the dummy conductive pattern 190 may have any shape of the dummy source lines as described above. A stress imposed on the cell region may be further reduced by the conductive patterns 190.

In a manufacture of the semiconductor device illustrated in FIG. 31, the peripheral circuits may be formed on the peripheral circuit region of the substrate 100. The peripheral circuit may include transistors.

Subsequently, processes substantially the same as or similar to FIGS. 5 to 13 may be performed to obtain the semiconductor device of FIG. 31. In the processes, a third opening 188 may be formed through the insulating interlayer on the peripheral circuit region while forming first and second openings 122 and 124. Thus, the dummy conductive pattern 190 may be formed in the third opening 188 while forming the CSL 144 and the dummy source line 146.

According to example embodiments, a dummy source line may be formed on a dummy region. A configuration or a shape of the dummy source line may be different from that of a common source line on a cell region. Thus, a stress imposed on the cell region may be dispersed and reduced while forming the common source line. At least a portion of dummy patterns may include the same conductive material as that included in gate lines. Thus, a nitride from sacrificial patterns may be fully removed or an amount of the nitride may be decreased, so a stress from the nitride may be also reduced. Therefore, stress-related defects in a semiconductor device may be suppressed.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a cell region and a dummy region;
first channel structures on the cell region of the substrate, the first channel structures extending in a first direction vertical with respect to a top surface of the substrate;
gate lines surrounding outer sidewalls of the first channel structures and extending in a second direction parallel to the top surface of the substrate, the gate lines being spaced apart from each other along the first direction;
cutting lines between the gate lines on the cell region, the cutting lines extending in the second direction;
dummy patterns spaced apart from each other along the first direction on the dummy region, the dummy patterns having a stepped shape along a third direction parallel to the top surface of the substrate and perpendicular to the second direction, at least a portion of the dummy patterns including a same conductive material as that included in the gate lines; and
dummy lines extending through the dummy patterns, the dummy lines having a different configuration than the cutting lines in a top view.

2. The semiconductor device as claimed in claim 1, wherein the dummy region is adjacent to an end portion of the cell region in the third direction.

3. The semiconductor device as claimed in claim 1, wherein the dummy lines include a same conductive material as that included in the cutting lines.

4. The semiconductor device as claimed in claim 1, wherein the dummy lines extend in the third direction and perpendicularly to the cutting lines.

5. The semiconductor device as claimed in claim 4, wherein a distance between the dummy lines is equal to or greater than a distance between the cutting lines.

6. The semiconductor device as claimed in claim 4, wherein:
at least one of the dummy patterns includes conductive patterns spaced apart in the second direction, and a sacrificial pattern interposed between the conductive patterns, and
the conductive patterns include a same conductive material as that of the gate lines, and the sacrificial pattern includes a nitride.

7. The semiconductor device as claimed in claim 1, wherein the dummy lines extend in a fourth direction diagonal to the second direction.

8. The semiconductor device as claimed in claim 1, wherein the dummy lines extend in the second direction.

9. The semiconductor device as claimed in claim 8, wherein a first portion of the dummy patterns includes a same conductive material as that of the gate lines, and a second portion of the dummy patterns different than the first portion includes a conductive pattern and a sacrificial pattern, the conductive pattern including the conductive material and the sacrificial pattern including a nitride.

10. The semiconductor device as claimed in claim 1, wherein the dummy patterns are positioned at corresponding levels of the gate lines.

11. The semiconductor device as claimed in claim 1, further comprising insulating interlayer patterns between the dummy patterns neighboring in the first direction and between the gate lines neighboring in the first direction.

12. The semiconductor device as claimed in claim 1, wherein the cutting lines are common source lines, and the dummy lines are dummy source lines having a different shape or direction from the common source lines, as viewed in the top view.

13. The semiconductor device as claimed in claim 1, further comprising a third channel structure extending through the dummy patterns on the dummy region of the substrate.

14. The semiconductor device as claimed in claim 1, further comprising a dummy cell on a portion of the cell region adjacent to the dummy region.

15. A semiconductor device, comprising:
a substrate including a cell region and a dummy region;
first channel structures on the cell region of the substrate, the first channel structures extending in a first direction vertical with respect to a top surface of the substrate;
gate lines surrounding outer sidewalls of the first channel structures and extending in a second direction parallel to the top surface of the substrate, the gate lines being spaced apart from each other along the first direction;

first insulating interlayer patterns between gate lines neighboring to each other in the first direction;

cutting lines interposed between the gate lines on the cell region, the cutting lines extending in the second direction;

dummy patterns spaced apart from each other along the first direction on the dummy region, the dummy patterns having a stepped shape along a third direction parallel to the top surface of the substrate and perpendicular to the second direction, at least a portion of the dummy patterns including a same conductive material as that included in the gate lines;

second insulating interlayer patterns between dummy patterns neighboring each other in the first direction; and dummy lines extending through the dummy patterns and the second insulating interlayer patterns, the dummy lines having a different configuration than the cutting lines in a top view.

16. A semiconductor device, comprising:

a substrate including a cell region and a dummy region;

first channel structures on the cell region of the substrate, the first channel structures extending in a first direction vertical with respect to a top surface of the substrate;

gate lines surrounding outer sidewalls of the first channel structures and extending in a second direction parallel to the top surface of the substrate, the gate lines being spaced apart from each other along the first direction;

common source lines between the gate lines on the cell region, the common source lines extending in the second direction;

dummy patterns spaced apart from each other along the first direction on the dummy region, the dummy patterns having a stepped shape along a third direction parallel to the top surface of the substrate and perpendicular to the second direction, at least a portion of the dummy patterns including a same conductive material as that included in the gate lines; and dummy source lines extending through the dummy patterns, the dummy source lines having a different direction or shape than the common source lines in a top view.

17. The semiconductor device as claimed in claim 16, wherein the dummy source lines extend from an outermost side of the dummy region toward the cell region in a different direction than the common source lines, as viewed in the top view.

18. The semiconductor device as claimed in claim 17, wherein a distance between neighboring dummy source lines is greater than a distance between neighboring common source lines.

19. The semiconductor device as claimed in claim 17, wherein the dummy source lines and the common source lines include a same conductive material.

20. The semiconductor device as claimed in claim 16, wherein the dummy source lines are a plurality of dummy source line segments spaced apart from each other in at least one of the second and third directions.

* * * * *